(12) United States Patent
Henrichs

(10) Patent No.: US 6,822,992 B2
(45) Date of Patent: *Nov. 23, 2004

(54) FOLDED CAVITY SURFACE-EMITTING LASER

(76) Inventor: Joseph R. Henrichs, 641 NE. Swann Cir., Lee's Summit, MO (US) 64086

( * ) Notice: Subject to any disclaimer, the term of this patent is extended or adjusted under 35 U.S.C. 154(b) by 0 days.

This patent is subject to a terminal disclaimer.

(21) Appl. No.: 10/770,180

(22) Filed: Feb. 2, 2004

(65) Prior Publication Data

US 2004/0156413 A1 Aug. 12, 2004

Related U.S. Application Data

(63) Continuation of application No. 09/621,888, filed on Jul. 22, 2000, now Pat. No. 6,704,336.
(60) Provisional application No. 60/208,988, filed on Jun. 1, 2000.

(51) Int. Cl.$^7$ ............................ H01S 5/00; H01S 3/081
(52) U.S. Cl. .......................................... 372/45; 372/93
(58) Field of Search ................................ 372/43–46, 93

(56) References Cited

U.S. PATENT DOCUMENTS

| | | | |
|---|---|---|---|
| 4,941,744 A | * | 7/1990 | Yokokura et al. ............ 356/482 |
| 4,942,585 A | | 7/1990 | Ungar |
| 5,117,433 A | * | 5/1992 | Tatsuno et al. ................ 372/22 |
| 5,172,384 A | | 12/1992 | Goronkin et al. |
| 5,206,872 A | * | 4/1993 | Jewell et al. .................. 372/46 |
| 5,208,800 A | | 5/1993 | Isobe et al. |
| 5,335,300 A | | 8/1994 | Hartman et al. |
| 5,432,812 A | * | 7/1995 | Kurobe et al. ................. 372/99 |
| 5,568,499 A | | 10/1996 | Lear |
| 5,784,507 A | | 7/1998 | Holm-Kennedy et al. |
| 5,832,017 A | | 11/1998 | Ramdani et al. |
| 5,903,586 A | | 5/1999 | Ramdani et al. |
| 5,943,359 A | | 8/1999 | Ramdani et al. |
| 5,978,398 A | | 11/1999 | Ramdani et al. |
| 6,081,542 A | | 6/2000 | Scaggs |
| 6,327,280 B1 | * | 12/2001 | Ducellier et al. ............. 372/20 |
| 6,350,997 B1 | | 2/2002 | Saeki |
| 6,424,669 B1 | | 7/2002 | Jiang et al. |
| 6,625,195 B1 | | 9/2003 | Henrichs |
| 6,704,336 B1 | * | 3/2004 | Henrichs ...................... 372/45 |
| 2003/0160254 A1 | | 8/2003 | Henrichs |
| 2003/0185265 A1 | | 10/2003 | Henrichs |
| 2003/0185266 A1 | | 10/2003 | Henrichs |
| 2004/0066821 A1 | | 4/2004 | Henrichs |

* cited by examiner

*Primary Examiner*—Minsun Oh Harvey
*Assistant Examiner*—Phillip Nguyen
(74) *Attorney, Agent, or Firm*—Kirkpatrick & Lockhart LLP

(57) ABSTRACT

A surface-emitting laser is disclosed. The laser includes a first confinement cladding layer and a second confinement cladding layer. The laser also includes an active gain area between the first and second confinement cladding layers. The laser also includes a first reflector assembly and a second reflector assembly. The first reflector assembly is adjacent the first confinement cladding layer and includes a polyhedral prism waveguide having a non-reflecting surface facing the first confinement cladding layer. The first reflector assembly includes at least one totally-reflecting surface for transversely redirecting incident photonic emissions to a different longitudinal location of the polyhedral prism waveguide. The second reflector assembly is between the active gain area and the second reflector assembly.

57 Claims, 14 Drawing Sheets

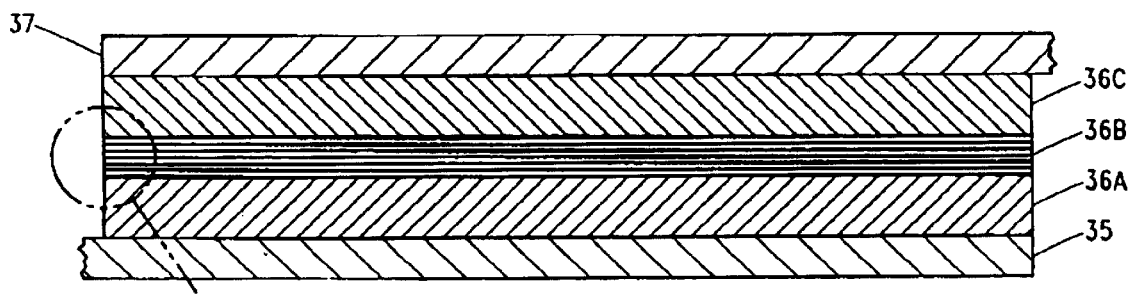
FIG. 20
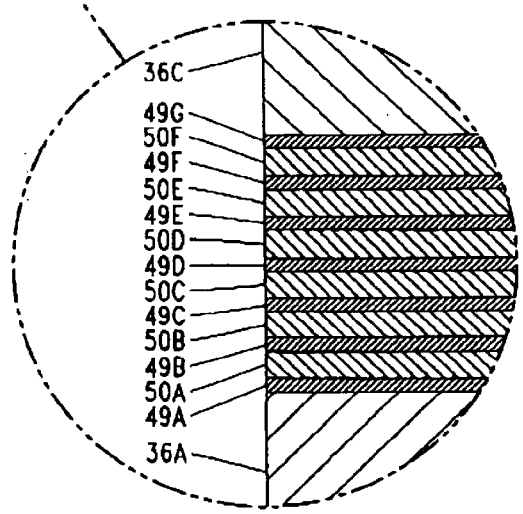
FIG. 20-A

FOLDED CAVITY SURFACE-EMITTING LASER

CROSS-REFERENCE TO RELATED APPLICATIONS

This application is a continuation under 35 U.S.C. §120 of U.S. patent application Ser. No. 09/621,888, filed Jul. 22, 2000, now U.S. Pat. No. 6,704,336, issued Mar. 9, 2004 ("the '336 patent"). The '336 patent is entitled to the benefit of Provisional Patent Application, Ser. No. 60/208,988, filed Jun. 1, 2000.

Embodiments of the invention described herein use, as the preferred embodiment of the polyhedral prism waveguide, the corner-cube prism mirror of nonprovisional patent application Ser. No. 09/357,685, filed Jul. 20,1999, now U.S. Pat. No. 6,625,195, and of provisional patent application Ser. No. 60/176,685, filed Jan. 19, 2000.

BACKGROUND OF THE INVENTION

Semiconductor laser diodes, specifically semiconductor laser diodes having a multilayered vertical cavity structure (i.e., vertical orientation that is perpendicular to the substrate of the semiconductor diode) have become widely known as (VCSELs) "Vertical Cavity Surface-emitting Lasers". However, while the present invention uses a vertically oriented LED structure to produce fundamental photonic radiation (i.e., spontaneous stimulation) and to provide gain, its feedback providing optical cavity and the physics that occur therein, are quit different from that of VCSEL laser diodes. Therefore, the present invention should be categorized as a new kind of semiconductor laser diode.

For example, the present invention, by using only one mirror in place of two mirrors to provide feedback, the present invention has redefined vertically orientated cavity design. Inspired by the present invention's unique optical physics and design, I have named this new semiconductor laser diode, for future identification, the (FCSEL) "Folded Cavity Surface-emitting Laser".

However, at this point I would like to digress by first describing some current trends in vertically oriented laser diode design of which, the most known and widely used is the VCSEL laser diode design. These light sources have been adopted for several applications, such as gigabit-Ethernet in a remarkably short amount of time. Due to their reduced threshold current, circular output beam, inexpensive, and high-volume manufacture, VCSELs are particularly suitable for multimode optical-fiber local-area networks (i.e., LANs).

Moreover, selectively oxidized VCSELs contain an oxide aperture within its vertical cavity that produces strong electrical and optical confinement, enabling high electrical-to-optical conversion efficiency and minimal modal discrimination; allowing emission into multiple transverse optical-modes. Such multi-mode VCSEL lasers make ideal local area network laser light sources. VCSELs that emit into a single optical transverse mode are ever increasingly being sought-out for emerging applications including data communication using single-mode optical fiber, barcode scanning, laser printing, optical read/write data-heads, and modulation spectroscopy. Consequently, achieving single-mode operation in selectively oxidized VCSELs is a challenging task, because the inherent index confinement within these high-performance laser diodes is very large. VCSELs have optical-cavity lengths approximately one-wavelength and therefore, operate within a single longitudinal optical-mode. However, because of their relatively large cavity diameters (i.e., roughly 5.0 to 20.0 micrometers), these laser diodes usually operate in multiple transverse optical-modes, where each transverse optical-mode possesses a unique wavelength and what is called a transverse spatial intensity profile (i.e., intensity pattern).

Moreover, for applications requiring small spot size or high spectral purity, lasing in a single transverse optical-mode, usually the lowest-order fundamental mode (i.e., TEM-00) is desired. In general, pure fundamental mode emission within a selectively oxidized VCSEL can be attained by increasing optical loss to higher-order transverse optical-modes relative to that of the previously mentioned fundamental mode. By selectively creating optical loss for any particular mode, we increase modal discrimination, which consequently leads to a VCSELs operation in a single transverse optical-mode. Strategies for producing VCSELs that operate in single transverse optical-mode have recently been developed.

Furthermore, these strategies are based either on introducing loss that is relatively greater for higher-order optical-modes and thereby, relatively increasing gain for the fundamental transverse optical-mode, or as an alternative, creating greater gain for the fundamental transverse optical-mode. Increased modal loss for higher-order optical-modes has been successfully demonstrated using three different techniques. The first approach to modal discrimination uses an etched-surface relief located on the periphery of the top facet that selectively reduces the reflectivity of the top mirror for higher-order transverse optical-modes. The advantage of this technique is that the ring located around the edge of the cavity, etched in the top quarterwave mirror stack assembly can be produced during the VCSEL's initial fabrication by conventional dry-etching, or it can be post processed on a completed VCSEL die using focused ion-beam etching. A disadvantage, however, of etched-surface relief is that it requires careful alignment to the oxide aperture and can increase the optical scattering loss of the fundamental transverse optical-mode, as manifested by the relatively low (i.e., less than 2 mW) single-mode output powers that have been reported. Therefore, it would be more desirable to introduce mode-selective loss into the VCSEL's structure during its epitaxial deposition to avoid extra fabrication steps and to provide self-alignment problems.

Moreover, two such techniques are the use of tapered oxide apertures and extended optical cavities within the VCSEL laser diode. The first approach, which was pursued extensively at Sandia National Laboratories (i.e., Albuquerque, N.M.), is predicated on designing the profile of the oxide aperture tip in order to preferentially increase loss for higher-order transverse optical-modes. The aperture-tip profile is produced by tailoring the composition of the (AlGaAs) "Aluminum-Gallium-Arsenide" layers, which are oxidized during fabrication to create an aperture located within the before mentioned VCSEL. A VCSEL containing a tapered oxide whose tip is vertically positioned at a null in the longitudinal optical standing wave can produce greater than 3-mW of single-mode output, and greater than 30-dB of side-mode suppression. Creating this structure, however, requires a detailed understanding of the oxidation process, and produces additional loss for the fundamental transverse optical-mode, as well.

In addition, a second way to increase modal discrimination is to extend the optical cavity length of VCSEL itself and thus, increase the diffraction loss for the higher-order transverse optical-modes. Researchers at the University of Ulm (i.e., Ulm, Germany) have reported single-mode operation up to 5-mW, using a VCSEL constructed with a 4-micrometer thick cavity spacer inserted within the optical-cavity. The problem, however, is that by using even-longer cavity spacers can also introduce multiple longitudinal optical-modes (i.e., what is sometimes called spatial hole burning), but single-transverse-optical-mode operation up to nearly 7-mW has been demonstrated. It is interesting to note that VCSELs containing multiple wavelength cavities do not appear to suffer any electrical penalty, although careful design is required to balance the trade-offs between the modal selectivity of the transverse and the longitudinal optical-modes.

Finally, manipulating the modal gain rather than loss can also produce single-mode VCSELs. A technique, designed to spatially aperture laser gain independently of the oxide aperture has been developed at Sandia National Laboratories. The essential aspect of these VCSELs is the lithographically defined gain region, which is produced by an intermixing of quantum-well active regions at the lateral periphery of the VCSEL's laser cavity. Typically, fabrication processes for a typical VCSEL laser diode begins with an epitaxial growth of the VCSEL's bottom (DBR) "Distributed Bragg Reflector" based quarterwave mirror-stack assembly onto an optical or semiconductor substrate. After which, the VCSEL's active-region (i.e., a multiple quantum well containing double-heterostructure) is epitaxially grown onto the top outermost surface of the bottom DBR. Finally, the VCSEL's top DBR quarterwave mirror-stack assembly is epitaxially grown onto the top outermost surface of the active-region.

In addition, a VCSEL's quantum wells are homogenized by ion-implantation around the masked regions that were used to create the cavity forming second DBR quarterwave mirror-stack assembly, during epitaxial material deposition. The resultant VCSEL has a central quantum-well active-region that preferentially provides gain for the fundamental mode. Consequently, for this approach only a single-mode output of more than 2-mW with a side-mode-suppression ratio greater than 40-dB is obtained. This approach also requires greater fabrication complexity, however, it is anticipated that higher performance can be reached with further refinement of process parameters. Because of the new and greater demands of VCSEL applications, new types of single-mode VCSELs are currently under development at numerous laboratories around the world. The techniques demonstrated to date introduce modal discrimination by increasing optical loss for the higher-order modes, or as an alternative, by increasing the relative gain of the fundamental optical-mode.

In addition, to better understand the structural differences between the present FCSEL invention and prior art VCSEL technology, a typical VCSEL design is presented as an example of prior art. As illustrated in FIGS. 1, 2, and 3, a typical VCSEL uses a process of recombining radiation (i.e., sometimes called "radiative recombination") to produce fundamental intra-cavity light, which, during multiple oscillations through a VCSEL's cavity containing active-region, is ultimately amplified into coherent laser emission. Prior art, as illustrated in FIGS. 1, 2, and 3 is an example of a high-frequency VCSEL laser diode design that uses a metallic supporting substrate 22 (FIG. 1) as both a base-reflecting mirror structure 22 (FIG. 2) and a substrate used for the subsequent epitaxial growth of multilayered structures. The substrate material is where a VCSEL typically begins its multi-layered construction, using epitaxial growth processes, such as molecular beam epitaxy (MBE) or metallic-organic chemical vapor deposition (MOCVD) to expedite deposition of optical and semiconductor construction material.

Furthermore, a VCSEL's metallic supporting substrate 22 (FIG. 3), when conductive, as an alternative embodiment, would serve as the VCSEL(s) electrically negative electrode. The metallic supporting substrate 22 that comprises a (Ni—Al) "Nickel-Aluminum" alloy-mixture which has between an "8.0" to a "12.0" percent material lattice-mismatch, or more specifically a "10.0" percent material lattice-mismatch to the binary (GaN) "Gallium-Nitride" semiconductor material deposited later. Nevertheless, despite (Ni—Al) "Nickel-Aluminum" lattice-mismatch it is still the preferred metallic alloy-mixture for this kind of electron conducting metallic supporting substrate 22. In addition, the (Ni—Al) "Nickel-Aluminum" metallic supporting substrate 22 (FIG. 3), if used as an alternative embodiment, would also need to exhibit a highly reflective property as well and, therefore should have a surface roughness of less than "15" atoms thick.

Furthermore, as illustrated in FIGS. 1, 2, and 3, prior art shows that several layers of (AlN) "Aluminum-Nitride" can be epitaxially grown, using MBE or MOCVD to create a single buffer-layer 23 (FIG. 3) with a thickness of only a few atoms. The AlN buffer-layer is used next for facilitating the MBE or MOCVD epitaxial growth of the many subsequent layers that will comprise a single VCSEL device. As illustrated in FIGS. 1, 2, and 3 prior art also shows that a VCSEL has its first DBR quarterwave mirror-stack assembly 24 epitaxially deposited onto the top outermost surface of the previously deposited buffer-layer 23A, 23B, 23C, 23D (FIG. 3) of (AlN) "Aluminum-Nitride" material, using any suitable epitaxial crystal growing method, such as MBE or MOCVD.

In addition, as illustrated in FIGS. 1, 2, and 3 prior art also shows that a VCSEL's first DBR quarterwave mirror-stack assembly 24 is made from a plurality of alternating layers comprised as mirror-pairs; or more precisely is made from a multitude of single pairs of alternating layers 24A, 24B (FIG. 3) that are constructed from (GaN/AlGaN) semiconductor materials, and used to complete a single mirror-pair. The plurality of alternating layers used to comprise the multitude of mirror-pairs, will include one or more layers of N-doped (GaN) "Gallium-Nitride" 24A, 24C, 24E, 24G, 24I (FIG. 3) a high-refractive semiconductor material, and N-doped (AlGaN) "Aluminum Gallium Nitride" 24B, 24D, 24F, 24H, 24J (FIG. 3) a low-refractive semiconductor material.

For example, as illustrated in FIGS. 1, 2, and 3 prior art shows that a layer 24A of N-doped (GaN) "Gallium-Nitride is epitaxially deposited onto the top and outermost surface of a VCSEL's buffer-layer 23 (FIG. 3), while a layer 24B (FIG. 3) of N-doped (AlGaN) "Aluminum Gallium Nitride" is subsequently and epitaxially deposited onto the top and outermost surface of the VCSEL's first N-doped (GaN) "Gallium-Nitride layer 24A (FIG. 3). If additional mirror-pairs are required, several more layers that make-up additional mirror-pairs can be deposited onto existing layers of (GaN) "Gallium-Nitride and (AlGaN) "Aluminum Gallium Nitride" materials 24A, 24B, 24C, 24D, 24E, 24F, 24H, 24I (FIG. 3).

Moreover, to increase the reflectivity of a VCSEL's first DBR quarterwave mirror-stack assembly 24 (FIG. 3) to the required amount of reflectance, many additional mirror-pairs will be required, and depending upon the wavelength of light being reflected, as many as several hundred mirror-pairs might be needed and used within a single VCSEL laser diode. It should be understood that the thickness and doping levels of each deposited layer used to construct a VCSEL laser diode is precisely controlled. Any deviation from designed parameters, no matter how slight, would affect the performance of the VCSEL in question (e.g., frequency range, flux intensity).

For example, as illustrated in FIGS. 1, 2, and 3, prior art shows that the VCSEL's emitter-layer 33, which is designed to emit laser-light having a wavelength of "200" nanometers, should have a material thickness that is one quarter of one wavelength of the VCSEL's laser emission. Which is altogether true for each of the other alternating layers that comprise both of the VCSEL's DBR quarterwave mirror-stack assemblies 24, 32 (FIG. 3). As illustrated in FIGS. 1, 2, and 3, prior art shows that all of the alternating layers used to comprise a VCSEL's first and second DBR quarterwave mirror-stack assemblies 24, 32 (FIG. 3) should have a material thickness of "50" nanometers.

Furthermore, the doping of a VCSEL device is typically accomplished during epitaxial deposition by the addition of various dopant materials (e.g., n-type electron donating dopants like Phosphorus and p-type electron accepting dopants like Boron) to the construction material used in the MBE or MOCVD epitaxial deposition process. Typically, a VCSEL device will use many different dopant concentrations of specific dopant materials within several different extrinsic semiconductor layers; planar shaped layers that ultimately make-up a VCSEL's various structures. For example, the alternating layers of (GaN) "Gallium-Nitride" 23A (FIG. 3) and N-doped (AlGaN) "Aluminum Gallium Nitride" 23B (FIG. 3), which are used to facilitate construction of a VCSEL's first DBR quarterwave mirror-stack assembly 24 (FIG. 3), can be made n-type and therefore, conductive, when doped with either "Selenium" or "Silicon", using a dopant concentration ranging from "1E15" to "1E20" cubic-centimeters with a preferred range from "1E17" to "1E19" cubic centimeters, while a nominal concentration range of doping would be from "5E17" to "5E18" cubic centimeters. The percentage of dopant composition in a VCSEL's first DBR quarterwave mirror-stack assembly 24 (FIG. 3), could be stated as (Al x Ga x N/GaN), where x represents a variable of "0.05" to "0.96", while in a preferred embodiment x represents an amount greater than "0.8".

Therefore, as illustrated in FIGS. 1, 2, and 3 prior art shows that after the plurality of alternating layers used in a VCSEL's first DBR quarterwave mirror-stack assembly 24 have been deposited onto the top and outermost surface of the VCSEL's buffer-layer of (AlN) "Aluminum-Nitride" 23, then the VCSEL's first contact-layer 25 (FIG. 3) comprising a highly +n-doped (GaN) "Gallium-Nitride" binary semiconductor material can be epitaxially grown onto the top and outermost surface of the last alternated layer of the VCSEL's first DBR quarterwave mirror-stack assembly 24 (FIG. 3). A VCSEL's first contact-layer 25, while providing connectivity to the VCSEL's n-metal contact 27 (FIG. 3) and to the VCSEL's n-metal contact-ring 26 (FIG. 1), will also enhance the reliability of the VCSEL's design by preventing the migration of carrier-dislocations, and the like to the VCSEL's active-region 28 (FIG. 3).

Furthermore, as illustrated in FIGS. 1, 2, and 3 prior art shows that to prevent the overcrowding of the cladding-layers located within a VCSEL's active-region 28 (FIG. 3), each of two cladding-layers 28A, 28C (FIG. 3) are shown here as being contra-located onto opposite sides of a single active-area 27B. Each illustrated cladding-layer 28A, 28C (FIG. 3) is epitaxially deposited onto a previously deposited layer, the last layer used in constructing the first DBR and the last layer used in constructing the active-area, respectfully. Each cladding-layer 28A, 28C is comprised from N-doped or P-doped (AlGaN) "Aluminum-Gallium-Nitride" ternary semiconductor material, respectfully.

Furthermore, as illustrated in FIGS. 1, 2, and 3 prior art also shows that a VCSEL's active-region 28 (FIG. 3), which is shown here as being represented by a single (SQW) "Single Quantum Well" layer that is epitaxially deposited onto the top and outermost surface of the VCSEL's first cladding-layer 28A (FIG. 3) (i.e., sometimes called a cladding-barrier). It should be understood, however, that a VCSEL's active-area 28 (FIG. 3) could also include one or more quantum-well cladding-layers and quantum-well layers, as is typical of MQW structure; particularly, a first quantum-well cladding-layer and a second quantum-well cladding-layer, with a quantum-well layer positioned between the first quantum-well cladding-layer and a second quantum-well cladding-layer. As illustrated in FIGS. 1, 2, and 3 prior art shows that a VCSEL's active-area 28B (FIG. 3) comprises as a SQW, which is constructed from a p-doped (InGaN) "Indium-Gallium-Nitride" extrinsic ternary semiconductor material, while using MBE or MOCVD to epitaxially deposit the material.

In addition, as illustrated in FIGS. 1, 2, and 3 prior art also shows that a VCSEL's second contact-layer 29 (FIG. 3) is comprised from a highly +p-doped (GaN) "Gallium-Nitride" extrinsic binary material that is epitaxially grown onto the top and outermost surface of the VCSEL's second cladding-layer 28C (FIG. 3). A VCSEL's second contact-layer 29, while providing connectivity to the VCSEL's p-metal contact 31 (FIG. 3) and to the VCSEL's p-metal contact-ring 30 (FIG. 1), will also enhance the reliability of the VCSEL's design by preventing the migration of carrier-dislocations, and the like to the VCSEL's active-region 28 (FIG. 3).

Furthermore, as illustrated in FIGS. 1, 2, and 3 prior art shows that a VCSEL's second DBR quarterwave mirror-stack assembly 32 is also made from a plurality of alternating layers, comprised as mirror pairs; or more precisely, a multitude of single pairs of alternating layers 32A, 32B (FIG. 3), which are constructed from (Al2O3/ZnO) optical dielectric materials, complete a single mirror-pair. The plurality of alternating layers, which includes one or more layers of undoped (Al2O3) "Aluminum-Oxide" high-refractive dielectric material (i.e., sometimes called Corundum or manufactured Sapphire) 32A, 32C, 32E, 32G, 32I (FIG. 3), and one or more layers of undoped (ZnO) "Zinc-Oxide" low-refractive dielectric material 32B, 32D, 32F, 32H (FIG. 3). For example, as illustrated in FIG. 1, FIG. 2, and FIG. 3 prior art shows that a layer 32A of (Al2O3) "Aluminum-Oxide" is epitaxially deposited onto a VCSEL's second contact-layer 29 (FIG. 3), while a layer 32B (FIG. 3) of (ZnO) "Zinc-Oxide" is subsequently and epitaxially deposited onto the VCSEL's first (Al2O3) "Aluminum-Oxide" layer 32A (FIG. 3).

Moreover, if additional mirror-pairs are required, several more layers that make-up additional mirror-pairs could be deposited onto the existing layers of (Al2O3) "Aluminum Oxide" and (ZnO) "Zinc Oxide" materials 32A, 32B, 32C, 32D, 32E, 32F, 32G, 32H, 32I (FIG. 3). To increase the reflectivity of a VCSEL's second DBR quarterwave mirror-stack assembly 32 (FIG. 3) to the required amount of partial-reflectance, many additional mirror-pairs will be required, and depending upon the wavelength of light being reflected, as many as several hundred mirror-pairs might be required and used to create a single mirror-stack assembly. Additionally, as illustrated in FIGS. 1, 2, and 3 prior art also shows that a VCSEL's emitter layer 33, which is constructed from undoped (ZnO) "Zinc-Oxide" high-refractive dielectric material is the last layer to be epitaxially deposited in the example VCSEL device.

In addition, as illustrated in FIGS. 1, 2, and 3 prior art shows that a VCSEL's p-metal contact 31 (FIG. 3), and the VCSEL's p-metal contact-ring 30 (FIG. 3) are typically formed onto the top and outermost surface of the VCSEL's second contact-layer 29 (FIG. 3), by disposing any suitable conductive material, such as Indium-Tin-Oxide, Gold, Zinc, Platinum, Tungsten, or Germanium metallic alloys. As illustrated in FIGS. 1, 2, and 3 prior art also shows that a VCSEL's n-metal contact 27 (FIG. 1) and the VCSEL's n-metal contact-ring 26 (FIG. 2) are typically formed onto the top and outermost surface of the VCSEL's first contact-layer 25 (FIG. 3), by disposing any suitable conductive material, such as Indium-Tin-Oxide, Gold, Zinc, Platinum, Tungsten, or Germanium metallic alloys.

Furthermore, when constructing a VCSEL's electrical contacts, it should be understood that the choice of one method of material deposition over another depends solely upon which construction material is selected. Therefore, specific methods of disposition, disposing, and patterning onto the VCSEL's first and second contact-layers 25, 29 (FIG. 3), for any specified material, must be considered in the construction of the VCSEL's electrical contacts. As illustrated in FIGS. 1, 2, and 3 prior art also shows that a VCSEL's second contact-layer 29 (FIG. 3), the VCSEL's second cladding-region 28C, the VCSEL's active-area 28B, and the VCSEL's first cladding-layer 28A (FIG. 3) are all mesa-etched. The process of mesa-etching, which ultimately defines the shape and structure of a VCSEL's lower layers, by causing diameter dimensions to remain substantially larger than the VCSEL's second DBR quarterwave mirror-stack assembly 32 (FIG. 2) and topmost emitter-layer 33 (FIG. 1) the second DBR supports. When mesa-etching and ion implantation steps are completed, a VCSEL's p-metal contact 31 (FIG. 3), and the VCSEL's p-metal contact-ring 30 are deposited onto the top and outermost surface of the VCSEL's second contact-layer 29, leaving the emitter-layer open 33 (FIG. 3).

In addition, the deposition of a VCSEL's n-metal contact 27, as an alternative embodiment, can be deposited onto the top and outermost surface of a VCSEL's metallic substrate 22 (FIG. 3) of (NiAl) "Nickel-Aluminum" alloy. Allowing, the total metallic substrate 22 to function as an electrically negative contact-layer. As illustrated in FIGS. 1, 2, and 3 prior art also shows that a VCSEL's metallic substrate 22 (FIG. 3), when it is used in conjunction with the VCSEL's first DBR quarterwave mirror-stack assembly 24, and because the VCSEL's first DBR quarterwave mirror-stack assembly 24 (FIG. 3) is constructed from highly-reflective (AlGaN/GaN) "Aluminum-Gallium-Nitride/Gallium-Nitride", both it and the VCSEL's metallic substrate 22 (FIG. 3) will provide approximately "99.99" percent of the VCSEL's total reflectivity. Additionally, illustrated in FIGS. 4, 5, and 6 is an example of how typical VCSEL laser diodes can be grouped together and configured into a linear array of laser diodes.

SUMMARY

In accordance with various embodiments of the present invention, a folded cavity surface-emitting laser comprises a cavity folding waveguide structure having at least one total internally reflecting prism providing for the redirection of intra-cavity produced fundamental photonic radiation into and out of transverse propagation within a single lengthened optical cavity, a double-heterojunction semiconductor diode active-region having an active-area providing for both the production and amplification of fundamental photonic radiation, a partial photon reflecting structure capable of reflecting sufficient undiffused optical radiation, providing input for the semi-reflected feedback and partial-reflected output of intra-cavity produced amplified photonic radiation.

Objects and advantages of the present invention include:

To provide a surface-emitting semiconductor laser diode that creates light amplifying feedback with only one quarterwave mirror-stack assembly, and a cavity folding internal reflecting polyhedral prism waveguide that comprises a single layer of dielectric material;

To provide a surface-emitting semiconductor laser diode that is inexpensive to manufacture, which is accomplished by eliminating the expensive epitaxial deposition of a bottom quarterwave mirror-stack assembly comprising a multitude of layered dielectric or semiconductor materials, and replacing it with a dielectric polyhedral prism waveguide inexpensively constructed using a single sputtered or epitaxially deposited layer;

To provide a surface-emitting semiconductor laser diode that uses two graded confinement cladding-layers to optically confine its active-area, increasing emission output exhibiting a narrower linewidth;

To provide a surface-emitting semiconductor laser diode that produces more effective output gain by using two graded confinement cladding-layers to lower the heat producing electrical resistance that normally occurs between contact-layers and cladding-layers;

To provide a surface-emitting semiconductor laser diode that increases optical confinement of its cavity with the addition of total internal-reflecting cladding material to the outermost wall surfaces of the laser diode's mesa-etched folded vertical cavity(s);

To provide a surface-emitting semiconductor laser diode that can be configured and utilized as a single laser device;

To provide a surface-emitting semiconductor laser diode that can be configured and utilized in a single laser-array comprising a multitude of individual laser diodes, which are individually addressable or together, addressable as a single group;

To provide a surface-emitting semiconductor laser diode or a surface-emitting semiconductor laser diode-array that can be manufactured at the same time and from the same semiconductor substrate material used to construct a laser-array's control-circuitry, all of which would be contained within a single semiconductor device;

To provide a surface-emitting semiconductor laser diode that replaces a bottom quarterwave mirror-stack assembly with a polyhedral prism waveguide which, if comprised of quartz or fused silica can reflect "100" percent, using a process of total internal-reflection, all wavelengths of optical radiation that enters the polyhedral prism waveguide's top front-face flat horizontal-surface;

To provide a surface-emitting semiconductor laser diode that can inexpensively construct its polyhedral prism waveguide using a well-known ion-milling process to slice out prism facet(s) comprising the polyhedral prism waveguide's structure;

To provide a surface-emitting semiconductor laser diode that can deposit a dielectric material, such as fused-silica, onto any light producing wide-bandgap semiconductor material, or combination thereof, which could possibly be used in the construction of a single surface-emitting semiconductor laser diode or a single surface-emitting semiconductor laser diode array;

To provide a surface-emitting semiconductor laser diode that uses an amorphous material, such as "Lithium-Fluoride" to construct, for mesa-etched vertical cavity(s), an optical-cladding total internal-reflecting material, which would also give added support to the polyhedral prism waveguide(s);

To provide a surface-emitting semiconductor laser diode that can increase its modal discrimination by extending its optical-cavity length, using a polyhedral prism waveguide to transversely redirect intra-cavity produced light to new areas of the diode's gain-region previously un-stimulated;

To provide a surface-emitting semiconductor laser diode that can increase its modal discrimination, using a process of total internal-reflection to redirect intra-cavity produced light out of its normal longitudinal propagation into a first transverse propagation, then next into a second transverse propagation, then next into a third transverse propagation, and then finally into a longitudinal, but reversed propagation, which will effectively increase diffraction loss for higher-orders of transverse optical-moded light, while sufficiently increasing gain to the fundamental lower-order transverse optical-moded light causing it to undergo amplification into laser emission;

To provide a surface-emitting semiconductor laser diode that has eliminated from its structure lattice-matched crystal growing buffer-layers, which are normally constructed using materials such as "Aluminum-Nitride";

To provide a surface-emitting semiconductor laser diode that produces at least an increase of nearly 7-mW for fundamental lower-order single-transverse optical-moded light;

Further objects and advantages are to provide a surface-emitting semiconductor laser diode, where selection of one semiconductor material over another, or more particularly, selection of one optical material over another for use in the construction of a FCSEL's active-region, a FCSEL's polyhedral prism waveguide, and a FCSEL's multilayered quarterwave mirror-stack assembly is not determined by a FCSEL's geometry or any other structural criteria, but is determined by a particular application's need for a specific wavelength(s).

Therefore, as presented here within this specification, the materials chosen for constructing the present FCSEL invention are presented here as only one example of several possible wavelength-specific semiconductor materials that might, or could be used to construct the present invention's wavelength transcendent structure. The advantages that are provided by novel features and un-obvious properties lie within a FCSEL's cavity-folding structure, and not within any particular material regime.

However, because the FCSEL's novel features and un-obvious properties can exist or occur using any wavelength-specific semiconductor or optical material regime, clearly shows that the various structures comprising the FCSEL laser diode, have both sufficient novelty and a non-obviousness that is independent of any one material regime that might, or could be used in the construction of a FCSEL laser diode(s).

Still further objects and advantages will become more apparent from a consideration of the ensuing description and drawings.

DRAWING FIGURES

In the drawings, closely related Figures have the same number but different alphabetic suffixes.

FIG. 20 shows a close-up side-view of a vertical section of a FCSEL's active-region displaying the active-region's two contact-layers, two cladding-layers, and an active-area comprising a multiple quantum-well.

FIG. 20A shows an auxiliary close-up side-view of a vertical section of the active-region's active-area displaying along an outer edge details of the active-area's multiple quantum-well.

DESCRIPTION OF THE INVENTION

Figure 7:
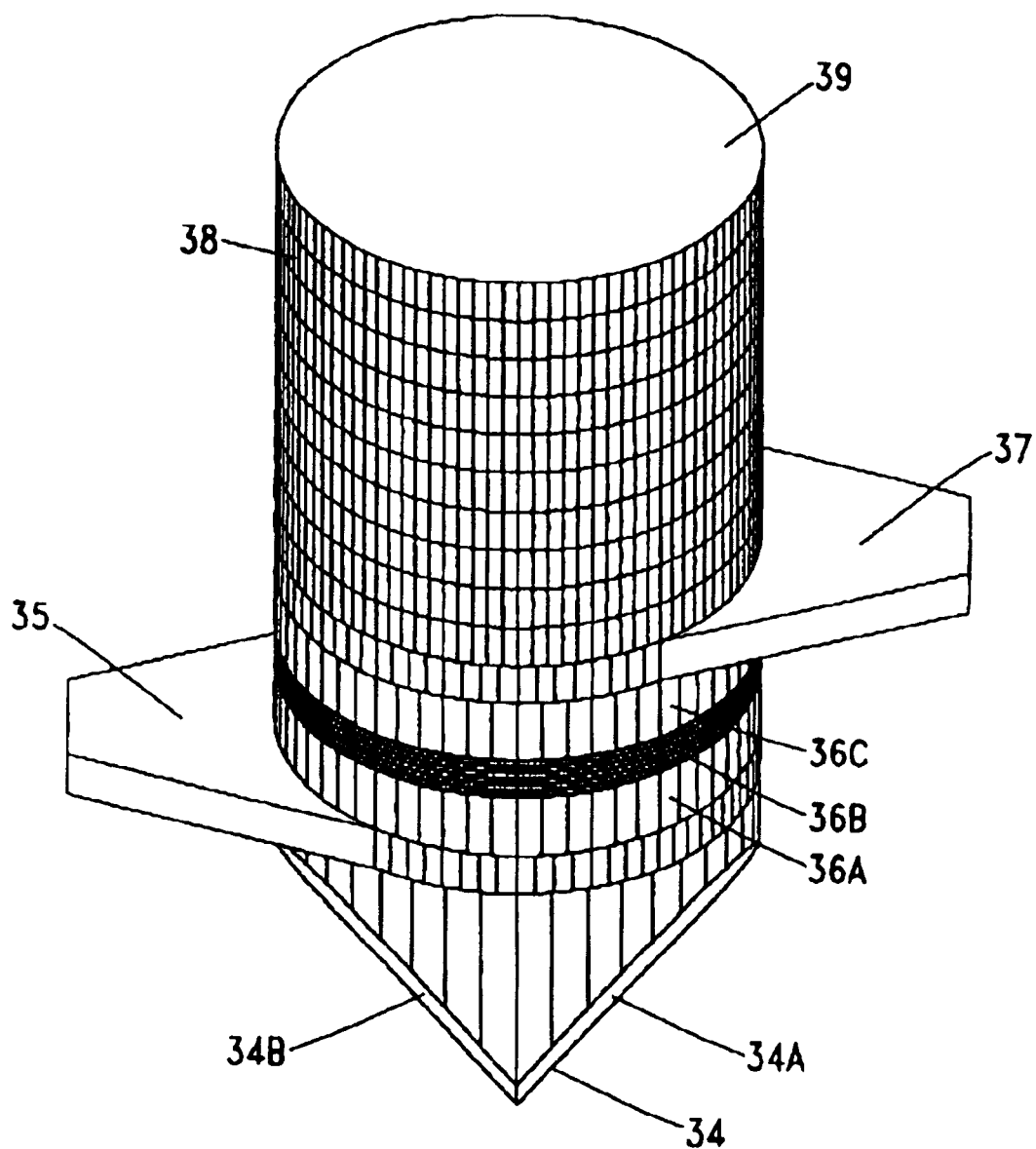
FIG. 7 shows the present invention, illustrated as a three-dimensional isometric top-front view of a FCSEL comprising a MQW active-region, a quarterwave mirror-stack assembly, and a cavity folding corner-cube shaped polyhedral prism waveguide.
Figure 8:
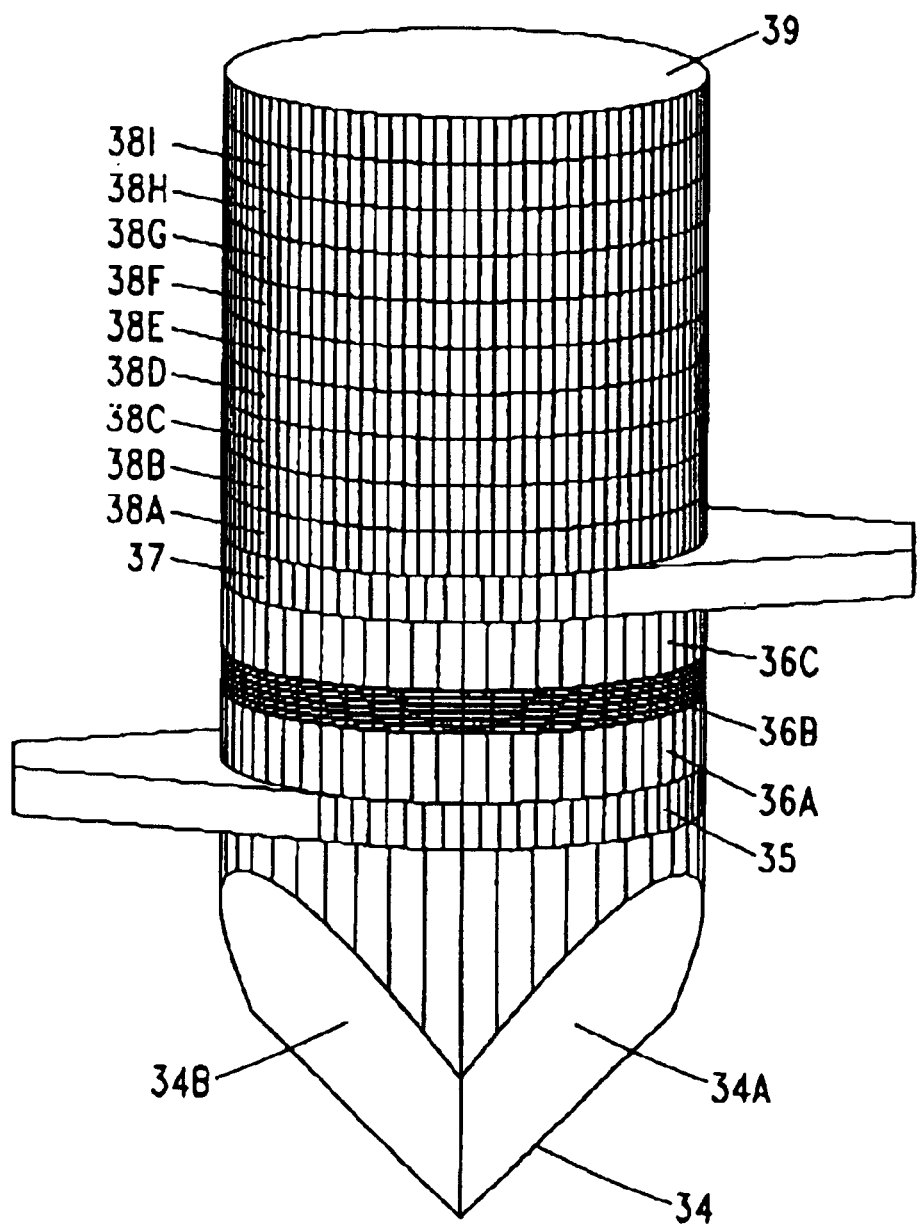
FIG. 8 shows the present invention, illustrated as a three-dimensional isometric top-front view of a FCSEL comprising a MQW active-region, a quarterwave mirror-stack assembly, and a cavity folding corner-cube shaped polyhedral prism waveguide.
Figure 9:
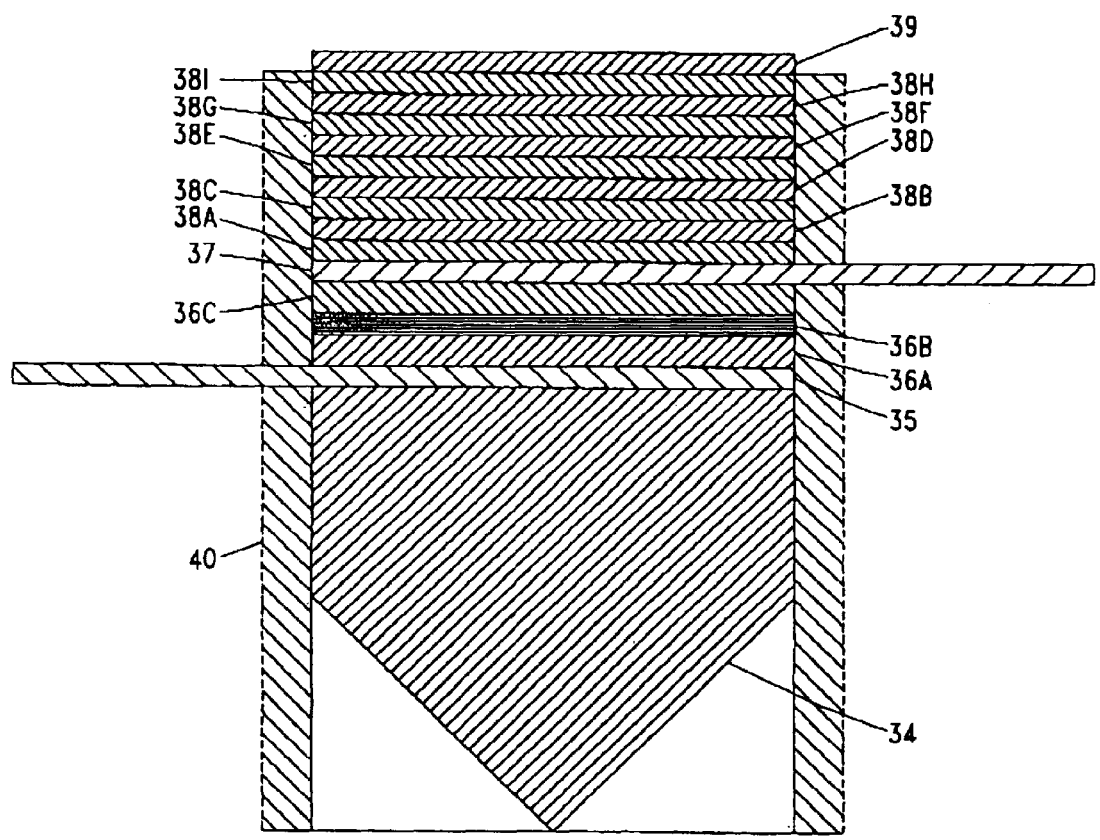
FIG. 9 shows the present invention, illustrated as an orthographic front-view vertical section that illustrates the multilayered structure of a FCSEL comprising a MQW active-region, a quarterwave mirror-stack assembly, and a cavity folding corner-cube shaped polyhedral prism waveguide.

A preferred embodiment of the present invention, as illustrated in FIGS. 7, 8 (i.e., two three-dimensional isometric-views of the FCSEL, displaying numbered semiconductor multilayers), and FIG. 9 (i.e., a sectional side view drawing) shows that the present invention may include a double-heterostructure light emitting diode design, which is configured as the present invention's active-region 36 and comprises: a (MQW) "Multiple Quantum Well" active-area 36B (FIG. 9), two contra-positioned graded confinement cladding-layers 36A, 36C (FIG. 9), a positive contact-layer 37 (FIG. 9), and a negative contact-layer that also plays the role of the diode's substrate 35 (FIG. 8). Wherein, this particular double-heterostructure light emitting diode design improves the performance of the present FCSEL invention in several ways:

By replacing conventional non-graded confinement cladding-layers 28A, 28C (FIG. 3) 52A, 52E (FIG. 21) which are normally used in today's double-heterostructure diode designs, with graded confinement cladding-layers 36A, 36C (FIG. 9), we increase the confinement of both electrons and holes to a FCSEL's MQW active-area 36B (FIG. 9). Because the graded confinement cladding-layers increase confinement of both electrons and holes to a FCSEL's MQW active-area 36B (FIG. 9) the process of "population inversion" occurring within the FCSEL's MQW active-area 36B will also increase.

Because the graded confinement cladding-layers 36A, 36C (FIG. 9) are created using a semiconductor material having a refractive index that gradually and evenly changes, from high to low, over the graded confinement cladding-layer's entire thickness, a high degree of reflectance is maintained, while the light scattering losses normally caused by internal photonic reflections at the multiple material boundaries of typical non-graded confinement cladding-layers 28A, 28C (FIG. 3) 52A, 52E (FIG. 21) is eliminated improving therein, the output gain and modal confinement of a FCSEL's laser emission output.

By using graded confinement cladding-layers 36A, 36C (FIG. 9) with evenly graded distribution of dopant materials, where the amount of dopant levels are higher at the material boundaries between contact-layers and cladding-layers, we have greatly reduce the resistance to electrical current at the material boundaries between contact and cladding-layers. By reducing resistance at the material boundaries between contact-layers and cladding-layers, we have increased current confinement, while reducing internally created heat.

By using two graded confinement cladding-layers 36A, 36C (FIG. 9) in conjunction with a MQW active-area 36B (FIG. 9) that are positioned between the FCSEL's previously mentioned two contact-layers 35, 37 (FIG. 9), we create a double-heterostructure semiconductor surface-emitting laser that will have lower current thresholds, lower internal heat, higher output gain, and smoother modulations of its laser emission output.

Moreover, when the present invention uses the double-heterostructure semiconductor (LED) "Light Emitting Diode" described in the paragraph above as its source of fundamental optical radiation, we create a surface-emitting laser diode that is capable of generating emission output that exhibits a narrower linewidth than those produced by current double-heterostructure semiconductor laser-diode designs. When the present FCSEL invention uses this particular double-heterostructure semiconductor (LED) "Light Emitting Diode" design as its source of fundamental optical radiation, because of the lower electrical resistance exhibited by its two graded confinement cladding-layers 36A, 36C (FIG. 9) the FCSEL's active-region 36 (FIG. 9) will produce less heat and therefore, a more effective output-gain that is greater than that currently exhibited by non-gradient double-heterostructure semiconductor diode designs.

The preferred embodiment of the present FCSEL invention, as illustrated in FIGS. 7, 8 (i.e., two three-dimensional isometric-views of the FCSEL, displaying numbered semiconductor multilayers), and FIG. 9 (i.e., a sectional side view drawing) are presented here only as an example of FCSEL design. FIGS. 7, 8, and 9 show that the construction of a FCSEL laser diode begins typically with the creation of a FCSEL's first "200" nanometers thick contact-layer 35 (FIG. 9), which is formed using a pre-manufactured and pre-sliced semiconductor wafer as a substrate. The substrate wafer is comprised from a seed-crystal of highly +n-doped (GaAs) "Gallium-Arsenide" binary material, having a crystallographic orientation of <100>, <111>, <110>, or <001>, and is used as the FCSEL's substrate for the subsequent growth of the FCSEL's remaining crystalline semiconductor layers. Additionally, a FCSEL's first contact-layer 35 (FIG. 9), while providing negative electrical connectivity to the FCSEL's light emitting active-region 36 (FIG. 9), will also enhance the reliability of the FCSEL's design, by preventing the migration of carrier-dislocations, and the like to the FCSEL's active-area 36B (FIG. 9).

In addition, and next in line for epitaxial deposition is a FCSEL's first "300" nanometers thick graded confinement cladding-layer 36A (FIG. 9), which is deposited, using MBE or MOCVD, onto the top and outermost surface of the FCSEL's first contact-layer 35 (FIG. 9), giving it a deposited position that lies between the FCSEL's first contact-layer 35 (FIG. 9) and the FCSEL's active-area 36B (FIG. 9). The FCSEL's first graded confinement cladding-layer 36A (FIG. 9) is comprised from a graded N-doped (GaAlAs) "Gallium-Aluminum-Arsenide" ternary material. Wherein, the ternary material's concentration of "Gallium" gradient will begin to gradually increase, starting from the first graded confinement cladding-layer's bottom-edge 36A (FIG. 9) and gradually increases upward toward the FCSEL's active-area 36B (FIG. 9).

For example, the amount of "Gallium" gradient will begin to increase from $Ga_{0.55}AlAs$, to $Ga_{0.60}AlAs$, to $Ga_{0.65}AlAs$, to $Ga_{0.70}AlAs$, to $Ga_{0.75}AlAs$, and finally to $Ga_{0.80}AlAs$ 36A (FIG. 9). While, in contrast, the ternary material's concentration of "Aluminum" gradient will begin to gradually decrease, starting from the first graded confinement cladding-layer's bottom-edge 36A (FIG. 9) and gradually decreases upward toward the FCSEL's active-area 36B (FIG. 9). For example, the amount of "Aluminum" gradient will begin to decrease from $GaAl_{0.45}As$, to $GaAl_{0.40}As$, to $GaAl_{0.35}As$, to $GaAl_{0.30}As$, to $GaAl_{0.25}As$, and finally to $GaAl_{0.20}As$ 36A (FIG. 9).

In addition, and next in line for epitaxial deposition is a FCSEL's single active-area 36B (FIG. 9), which constitutes the FCSEL's active gain-medium, which, through the process of "stimulated emission", can produce additional coherent light when optically pumped by intra-cavity produced "spontaneous emission" occurring within the FCSEL's double-heterostructure diode. The previously mentioned active gain-medium is illustrated as a FCSEL's active-area, which is located within the FCSEL's active-region 36 (FIG. 7).

Moreover, a FCSEL's active-area 36B (FIG. 9) is shown as a multi-layered MQW structure that lies between the FCSEL's first 36A (FIG. 9) and second 36C (FIG. 9) graded confinement cladding-layers. The previously mentioned multi-layered MQW structure of a FCSEL is comprised as seven quantum wells 49A, 49B, 49C, 49D, 49E, 49F, 49G (FIG. 20-A), which are constructed using a binary (GaAs) "Gallium-Arsenide" semiconductor material having a small forbidden bandwidth, and six quantum well cladding-layers 50A, 50B, 50C, 50D, 50E, 50F (FIG. 20-A), which are constructed using a ternary (GaAlAs) "Gallium-Aluminum-Arsenide" semiconductor material having a very large forbidden bandwidth. Additionally, all thirteen semiconductor layers used to comprise a FCSEL's active-area 36B (FIG. 9), when they are combined form a MQW structure having a combined thickness that is equal to one quarter of one wavelength of the fundamental light created by the FCSEL's active-region 36 (FIG. 8).

For example, if a FCSEL's active-region 36 (FIG. 7) were designed to create light having a fundamental wavelength of "800" nanometers, then the active-area's 36B (FIG. 9) total thickness would need to be one-quarter (i.e., "200" nanometers) of one wavelength of the fundamental "800" nanometer light created by the FCSEL's active-region 36 (FIG. 8). Therefore, the combined thickness' of the previously mentioned multiple quantum wells and multiple quantum well cladding-layers that comprise the FCSEL's active-area 36B should have a dimension of "200" nanometers, or one-quarter of one wavelength of the fundamental "800" nanometer light created by the FCSEL's active-region 36 (FIG. 7).

Furthermore, if a FCSEL's active-area 36B (FIG. 20) had seven quantum wells 49A, 49B, 49C, 49D, 49E, 49F, 49G (FIG. 20-A) comprised of binary (GaAs) "Gallium-Arsenide" semiconductor material the seven quantum wells 49A, 49B, 49C, 49D, 49E, 49F, 49G (FIG. 20-A) would, each need to have a material thickness of about "10.30" nanometers. In addition, if a FCSEL's active-area 36B had six quantum well cladding-layers 50A, 50B, 50C, 50D, 50E, 50F (FIG. 20-A) comprised of ternary (GaAlAs) "Gallium-Aluminum-Arsenide" semiconductor material the six quantum well cladding-layers 50A, 50B, 50C, 50D, 50E, 50F (FIG. 20-A) would, each need to have a material thickness of about "21.30" nanometers. The thickness amounts for each of the seven quantum wells and six quantum well cladding-layers located within the FCSEL's active-area 36B (FIG. 9), when combined should have a total material thickness equal to "200" nanometers or one-quarter of one wavelength of the fundamental "800" nanometer light created by the FCSEL's active-region 36 (FIG. 8).

Figure 19:
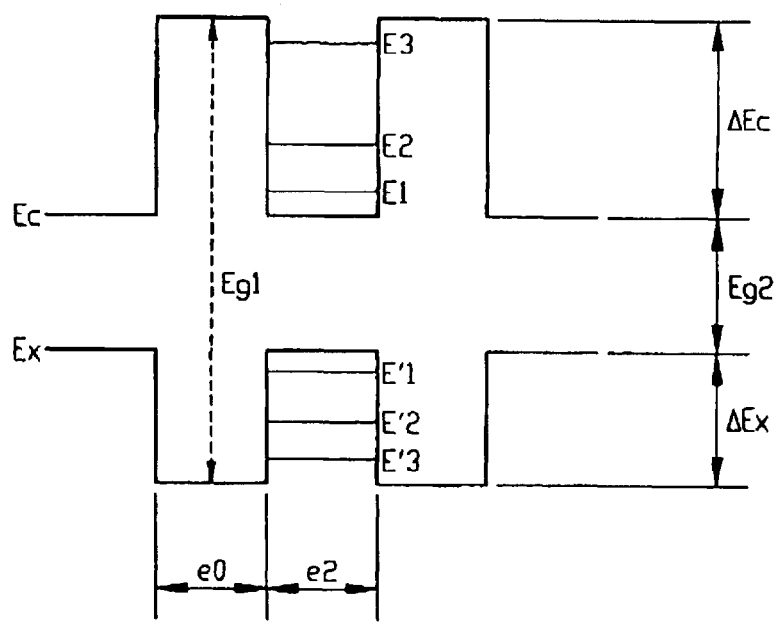
FIG. 19 shows a schematic drawing that displays energy profiles for the multiple quantum well active-area used by the FCSEL.

In addition, the preferred embodiment of the present invention, as illustrated in FIG. 19, shows from the energy standpoint, a FCSEL's MQW structure as being diagrammatically characterized. More specifically, FIG. 19 illustrates the profile of the potential wells and the discreet energy levels assumed by the carriers respectively in the conduction and valency bands (i.e., respectively electrons and holes). When, an epitaxy, semiconductor film with a small forbidden band e2 (e.g., film with a typical thickness of about ten nanometers), such as films 49A, 49B, 49C, 49D, 49E, 49F, 49G (FIG. 20-A), which are surrounded by two films having a larger forbidden band e0 (e.g., film with a typical thickness of about twenty nanometers), such as films 50A, 50B, 50C, 50D, 50E, 50F (FIG. 20-A), the previously mentioned electrons and holes of the small forbidden band material 49A, 49B, 49C, 49D, 49E, 49F, 49G (FIG. 20-A) are confined in monodirectional potential wells e2.

Therefore, as illustrated in FIG. 19, the movement of an electron into a well created in the conduction band of height $\Delta E_c$ is quantified in discreet states of energy $E_1$, $E_2$, $E_3$, etc. Moreover, in the same way, the movement of a hole into a well created in the valency band of height $\Delta E_x$ is quantified in discreet states of energy $E'_1$, $E'_2$, and $E'_3$. When the thickness of the small forbidden bandwidth material e2 varies, the energy states assumed by the carriers also vary. Therefore, the emission length of the previously mentioned MQW structures can be consequently adjusted by the choice, the nature, and the thickness of the semiconductor material films used in their construction.

In addition, and next in line for epitaxial deposition is a FCSEL's second "300" nanometers thick graded confinement cladding-layer 36C (FIG. 9), which is deposited, using MBE or MOCVD, onto the top and outermost surface of the FCSEL's active-area 36B (FIG. 9), giving it a deposited position that lies between the FCSEL's active-area 36B (FIG. 9) and the FCSEL's second contact-layer 37 (FIG. 9). A FCSEL's second graded confinement cladding-layer 36C (FIG. 9) is comprised from a graded P-doped (GaAlAs) "Gallium-Aluminum-Arsenide" ternary semiconductor material. Wherein, the ternary material's concentration of "Gallium" gradient will begin to gradually increase, starting from the second graded confinement cladding-layer's top-edge 36C (FIG. 9) and gradually increases downward toward the FCSEL's active-area 36B (FIG. 9).

For example, the amount of "Gallium" gradient begins to increase from $Ga_{0.55}AlAs$, to $Ga_{0.60}AlAs$, to $Ga_{0.65}AlAs$, to $Ga_{0.70}AlAs$, to $Ga_{0.75}AlAs$, and finally to $Ga_{0.80}AlAs$ 36C (FIG. 9). While, in contrast, the ternary material's concentration of "Aluminum" gradient begins to gradually decrease, starting from the second graded confinement cladding-layer's top-edge 36C (FIG. 9) and gradually decreases downward toward the FCSEL's active-area 36B (FIG. 9). For example, the amount of "Aluminum" gradient begins to decrease from $GaAl_{0.45}As$, to $GaAl_{0.40}As$, to $GaAl_{0.35}As$, to $GaAl_{0.30}As$, to $GaAl_{0.25}As$, and finally to $GaAl_{0.20}As$ 36C (FIG. 9).

In addition, and next in line for epitaxial deposition is a FCSEL's second "200" nanometers thick contact-layer 37

(FIG. 7), which comprises a highly +p-doped (GaAs) "Gallium-Arsenide" binary semiconductor material that is epitaxially grown onto the top and outermost surface of the FCSEL's second graded confinement cladding-layer 36C (FIG. 9), giving it a deposited position, that lies between the FCSEL's second graded confinement cladding-layer 36C (FIG. 9) and the FCSEL's semi-reflecting quarterwave mirror-stack assembly 38 (FIG. 8). Additionally, a second contact-layer 37 (FIG. 7), while providing positive electrical connectivity to the FCSEL's active-region 36 (FIG. 8), will also enhance the reliability of the FCSEL's laser design, by preventing the migration of carrier-dislocations, and the like to the FCSEL's active-area 36B (FIG. 9).

In addition, and next in line for epitaxial deposition is a FCSEL's quarterwave mirror-stack assembly 38 (FIG. 7), which is a single quarterwave mirror-stack assembly that is comprised from a plurality of thin-film mirror-pairs. The creation of a single mirror-pair is accomplished, when a layer composed of an optical material exhibiting a high-refractive index property is alternately deposited, using MBE, MOCVD, or Sputtering onto a previously deposited layer constructed using an optical material exhibiting a low-refractive index.

Furthermore, a FCSEL's semi-reflecting quarterwave mirror-stack assembly 38 (FIG. 8), which is made from a plurality of alternating layers, is alternately constructed using low and high-refractive optical materials, and used by the FCSEL laser diode as both feedback-providing input and output mirror. For example, a plurality of one or more layers of (MgF2) "Magnesium-Difluoride" material, and one or more layers of (CaCO3) "Calcium-Carbon-Trioxide" (i.e., sometimes called Calcite) material are alternately deposited, using MBE, MOCVD, or sputtering onto the top and outermost surface of the FCSEL's second "200" nanometers thick contact-layer 37 (FIG. 7). The FCSEL's second "200" nanometers thick contact-layer 37 (FIG. 7) is constructed from a highly +p-doped (GaAs) "Gallium-Arsenide" binary semiconductor material that is epitaxially grown onto the top and outermost surface of the FCSEL's second graded confinement cladding-layer 36C (FIG. 9). To example further, a layer of (MgF2) "Magnesium-Difluoride" material "200" nanometers thick 38A (FIG. 9) is deposited onto the top and outermost surface of a FCSEL's second "200" nanometers thick contact-layer, while a layer of (CaCO3) "Calcium-Carbonate" (i.e., sometimes called Calcite) material "200" nanometer thick 38B (FIG. 9) is subsequently deposited onto the top and outermost surface of the quarterwave mirror-stack assembly's first "200" nanometers thick layer of (MgF2) "Magnesium-Difluoride" optical material 38A (FIG. 9). Thereby, making a single mirror-pair of (MgF2/CaCO3) reflectors 38A, 38B. If additional mirror-pairs are required, several more layers of additional mirror-pairs can be deposited onto the top and outermost surface of the existing "200" nanometers thick layers of (MgF2) "Magnesium-Difluoride" 38A, 38C, 38E, 38G, 38I (FIG. 9) and "(CaCO3) "Calcium-Carbon-Trioxide" 38B, 38D, 38F, 38H, 39 (FIG. 9). The pluralities of alternating layers that comprise a FCSEL's quarterwave mirror-stack assembly are typically formed from one mirror-pair to ten mirror-pairs, with a preferred number of mirror-pairs ranging from four to five mirror-pairs 38 (FIG. 8).

Figure 15:
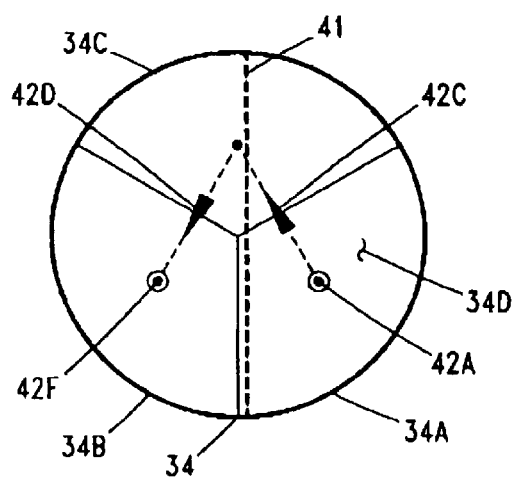
FIG. 15 shows an orthographic plan-view of the present invention's corner-cube shaped polyhedral prism waveguide, while displaying the raytraced path of an internally reflected light-ray.
Figure 16:
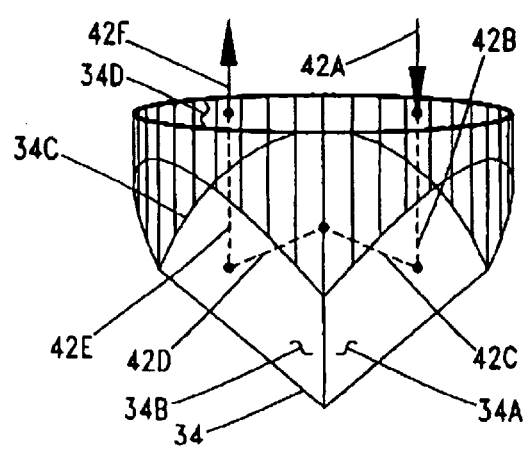
FIG. 16 shows a three-dimensional isometric top side-view of the present invention's corner-cube shaped polyhedral prism waveguide, while displaying the raytraced path of an internally reflected light-ray.

In addition, and next in line for epitaxial deposition is a FCSEL's internal reflecting corner-cube shaped polyhedral prism waveguide 34 (FIG. 7) which, if comprised of Quartz or (SiO2) "Fused Silicon-Dioxide" (i.e., sometimes called fused silica) material, will reflect internally "100" percent, any wavelength of optical radiation that enters its plane-parallel, flat horizontal, and circular top front-face surface FIG. 15, FIG. 16. A FCSEL's corner-cube polyhedral prism waveguide is exactly what its name implies, a polyhedral prism based waveguide having the shape of a cube's corner 34 (FIG. 8), which is cut off orthogonal to one of its (i.e., body-diagonal) triad axes, while the resultant polyhedral prism's top plane-parallel and flat horizontal surface is as a result, formed into a planar-flat and circular surface FIG. 15, FIG. 16. Additionally, as an added result of its construction, a FCSEL's corner-cube polyhedral prism waveguide's three polyhedral prisms are designed to totally redirect internally, all incoming light-rays 42A (FIG. 15), (FIG. 16) a "180" degrees backwards toward their original direction and light source, no matter what the aforesaid light-rays' angle of incidence was when it entered the corner-cube polyhedral prism waveguide's plane-parallel, flat horizontal, and circular top front-face surface. Therefore, an internally reflected light-ray is shifted laterally by an amount, which depends upon the light-ray's point of entry.

Furthermore, a FCSEL's corner-cube polyhedral prism waveguide 34, as illustrated in FIG. 15 (i.e., an isometric three-dimensional-view), displays a transparent three-dimensional corner-cube prism juximposed with the resultant raytraced pathway of an incoming 42A (FIG. 15) and then outgoing 42F (FIG. 15) light-ray that was incidental upon corner-cube's plane-parallel, horizontal, and circular front-face top surface. A FCSEL's corner-cube polyhedral prism waveguide 34, as illustrated in FIG. 16 (i.e., an orthographic top plan-view), displays a transparent three-dimensional corner-cube prism juximposed with the resultant raytraced pathway of an incoming 42A (FIG. 16) and then outgoing 42F (FIG. 16) light-ray that was incidental upon corner-cube's plane-parallel, horizontal, and circular front-face top surface. The main function of FIGS. 15 and 16 is to illustrate, through the use of two simple geometric diagrams, just how light-rays 42A behave, upon entering a FCSEL corner-cube polyhedral prism waveguide's plane-parallel, horizontal, and circular front-face top surface, when they are internally redirected "180" degrees backwards toward their originating light source 42F.

Moreover, when a light-ray 42F (FIG. 15), (FIG. 16) enters the before mentioned plane-parallel, flat horizontal, and circular top front-face surface of a FCSEL's corner-cube polyhedral prism waveguide 34 (FIG. 15), (FIG. 16) it will first travel to one of the corner-cube polyhedral prism waveguide's three internal polyhedral prism facets located at the corner-cube polyhedral prism waveguide's bottom 34A, 34B, 34C, where it 42B will be redirected 42C a "100" percent from a first internal polyhedral prism facet-face 34A to a second internal polyhedral prism facet-face 34C, where it will be redirected 42D a "100" percent to a third internal polyhedral prism facet-face 34B (FIG. 15), (FIG. 16), where it will be redirected 42E a "100" percent up and out of the FCSEL's corner-cube polyhedral prism waveguide's plane-parallel, flat horizontal, and circular top front-face surface 42F backwards into the FCSEL's vertical cavity for further amplification.

Figure 1:
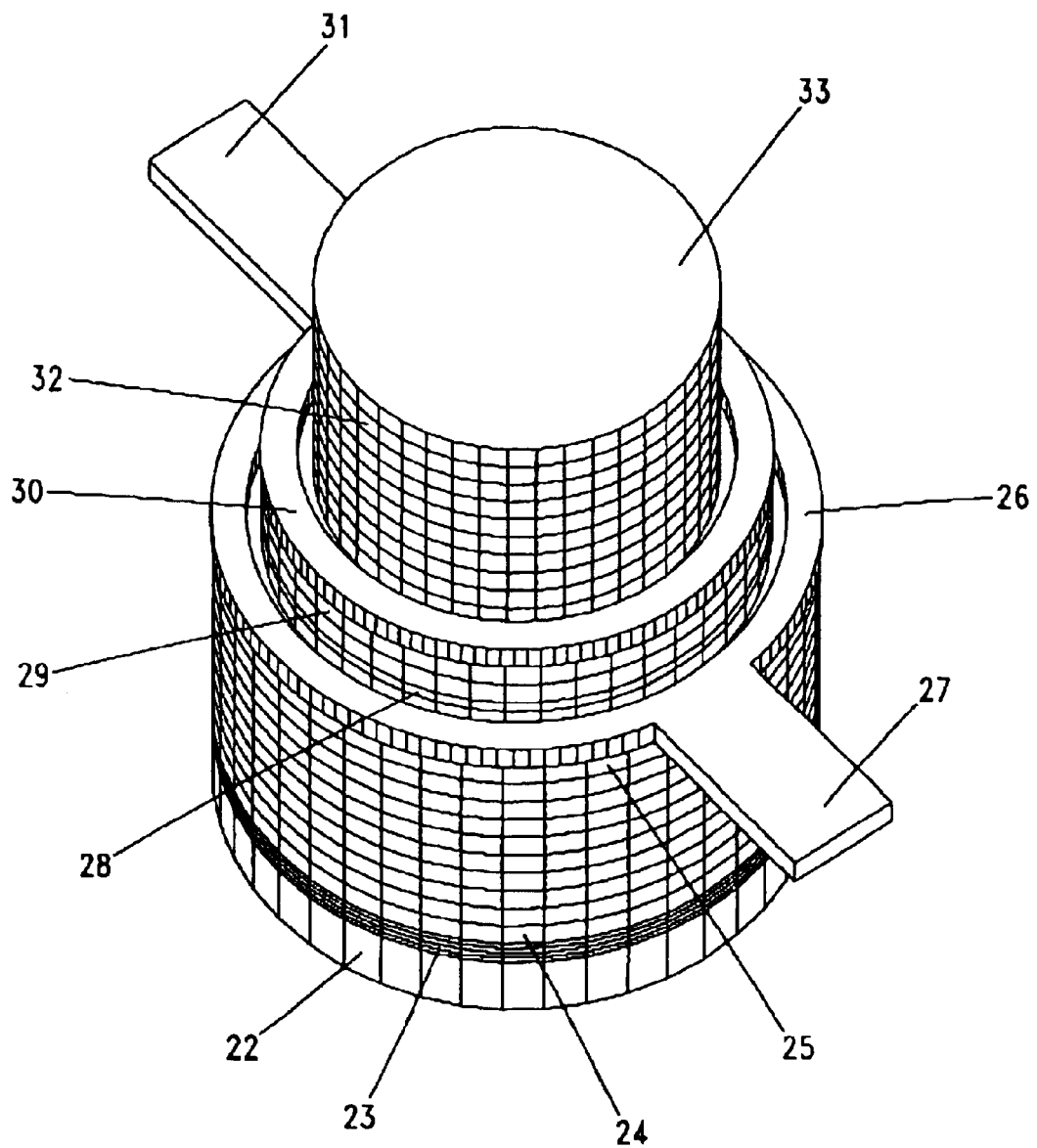
FIG. 1 shows prior art, illustrated as a three-dimensional isometric top side-view of a mesa-etched VCSEL comprising one substrate layer, one active-region, and two quarterwave mirror-stack assemblies.
Figure 2:
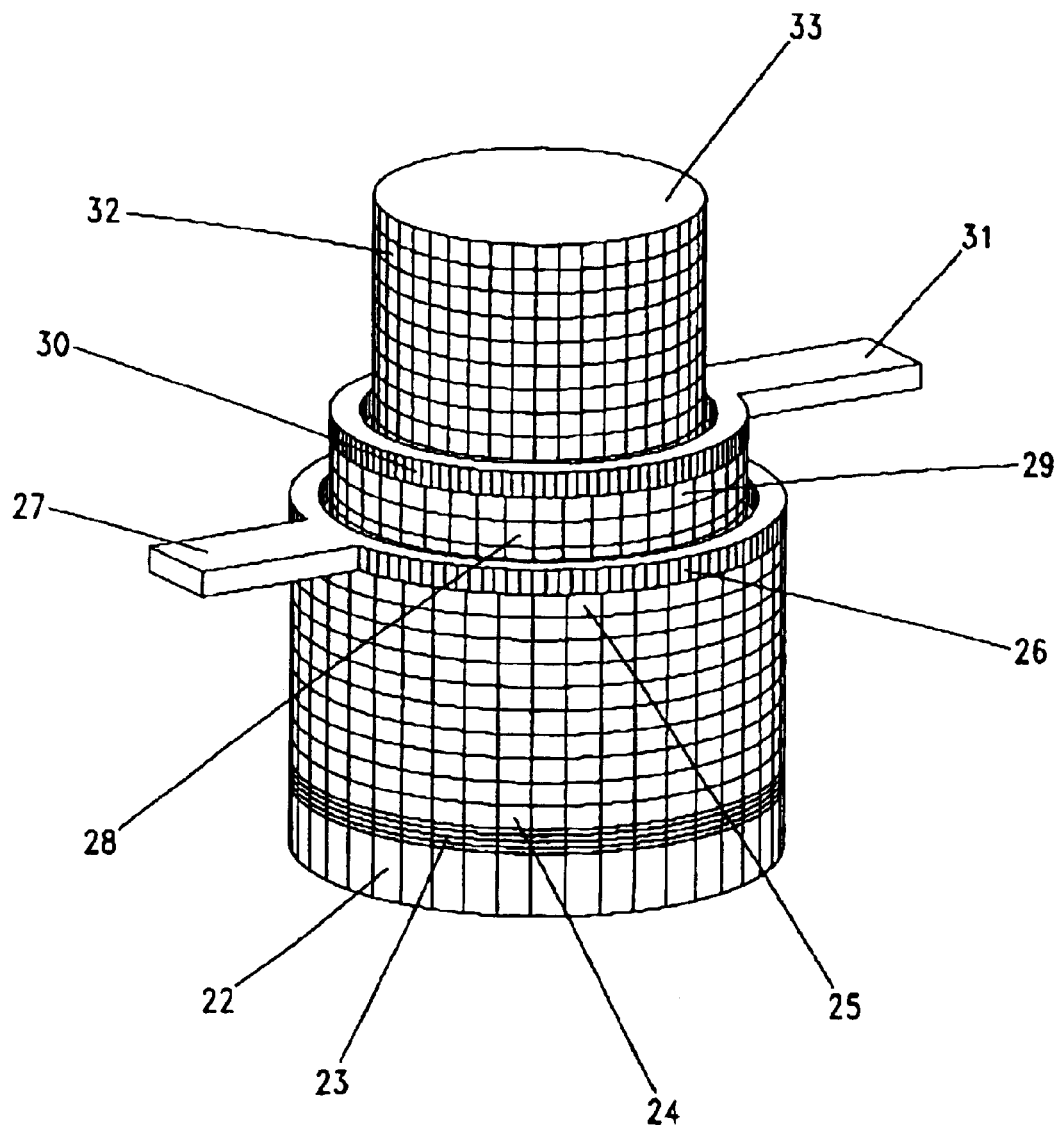
FIG. 2 shows prior art, illustrated as a three-dimensional isometric top side-view of a mesa-etched VCSEL comprising one substrate layer, one active-region, and two quarterwave mirror-stack assemblies.
Figure 3:
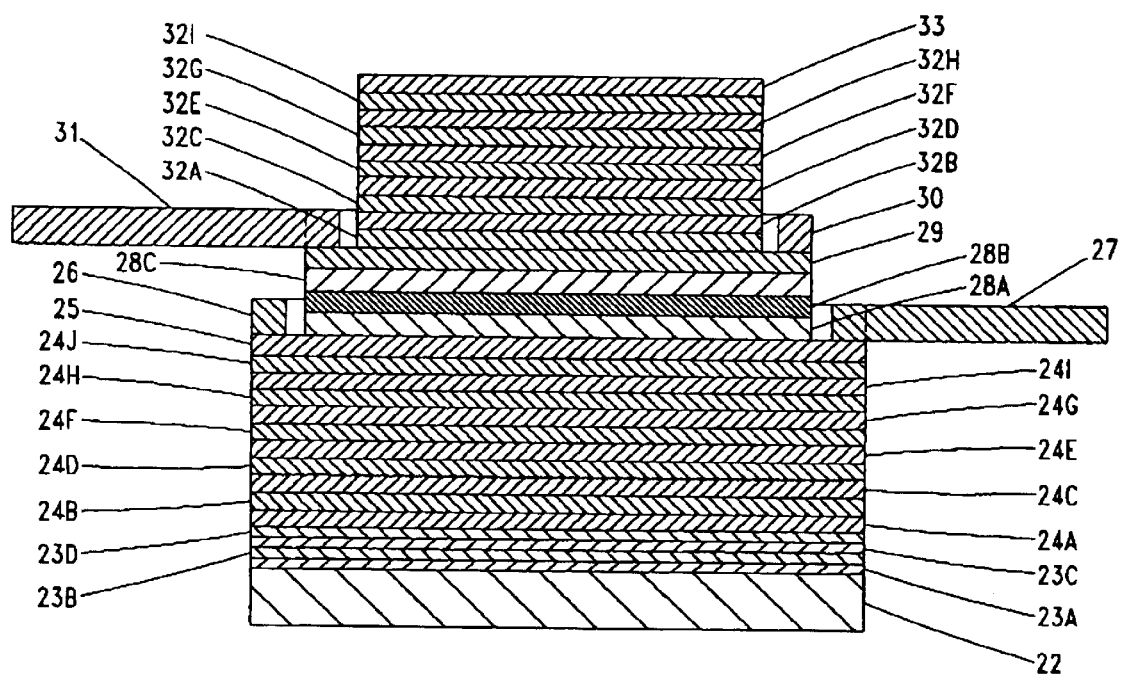
FIG. 3 shows prior art, illustrated as an orthographic side-view vertical section of a mesa-etched VCSEL displayed as a multilayered structure comprising one substrate layer, one active-region, and two quarterwave mirror-stack assemblies.
Figure 4:
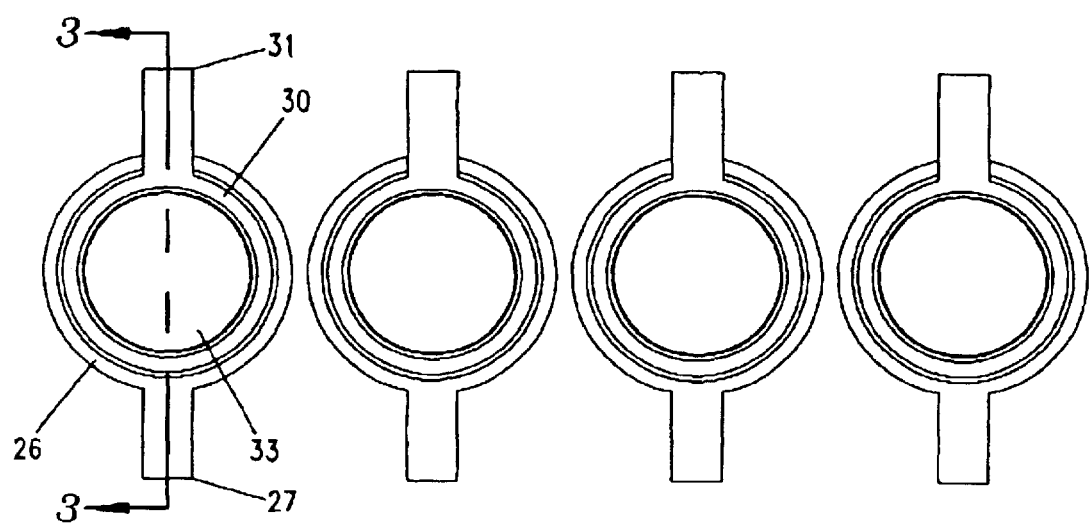
FIG. 4 shows prior art, illustrated as an orthographic plan-view of a linear array of four VCSELs comprising n-metal connector rings, p-metal connector rings, n-metal connectors, p-metal connectors, emitter-layers, and section line 3—3.
Figure 5:
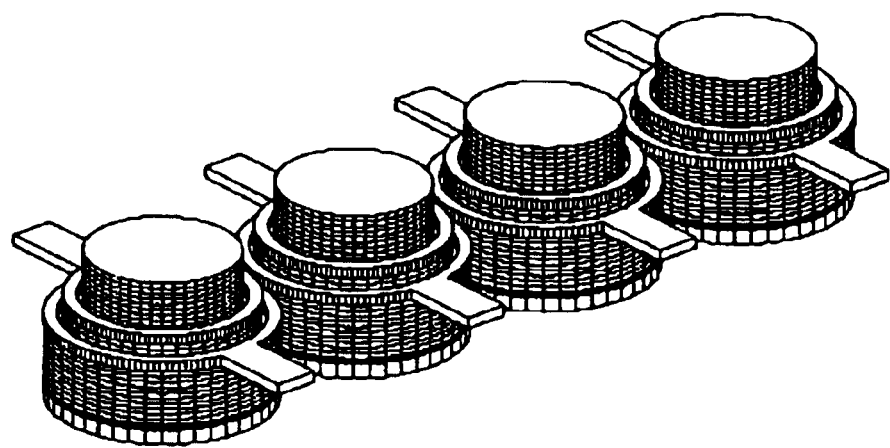
FIG. 5 shows prior art, illustrated as a three-dimensional isometric top-right side-view of four mesa-etched VCSELs shown in a linear array configuration.
Figure 6:
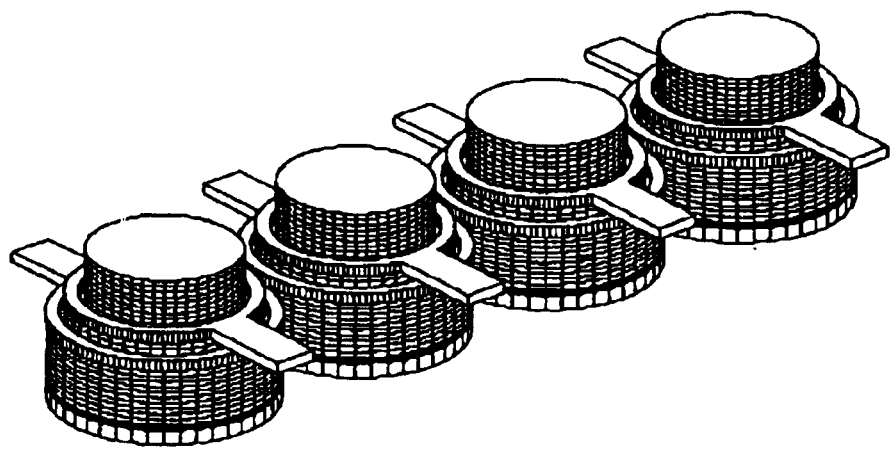
FIG. 6 shows prior art, illustrated as a three-dimensional isometric top-left side-view of four mesa-etched VCSELs shown in a linear array configuration.

In addition, the preferred embodiment of the present invention as illustrated in FIGS. 13, 14, 15, 16, 17, and 18 shows that a polyhedral prism waveguide 34, 43, 46 has replaced what is typically known in prior-art VCSEL design as the first or base quarterwave mirror stack assembly. Typically, as illustrated in FIGS. 1–3, before a MBE or MOCVD epitaxial deposition of (AlN) "Aluminum-Nitride" and (GaN) "Gallium-Nitride" (AlGaN) "Aluminum-Gallium-Nitride", which are the two semiconductor materials used to construct a high-frequency VCSEL's first quarterwave mirror stack assembly, the pre-deposition of a crystal growing buffer-layer material like (AlN) "Aluminum-Nitride" onto the top and outermost surface of the metallic supporting substrate 22 (FIG. 3) is required. However, by using a FCSEL's polyhedral prism waveguide 34, 43, 46 made from "Fused Silica" is used in place of the more typical quarterwave mirror stack assembly the need for this process is eliminated.

Furthermore, the location of a FCSEL's polyhedral prism waveguide is at the base of the FCSEL's vertical cavity; replacing the more conventional metallic alloy and/or sapphire substrates 22 and the planar-flat multilayered quarterwave mirror stack assemblies 24 (FIG. 3) normally used in prior-art VCSEL designs, with a single layered monolithic structure 34, 43, 46 made from "Fused Silica" that will transmit all frequencies of optical radiation. Unlike the quarterwave mirror-stack assemblies normally used in prior-art VCSEL designs, the polyhedral prism waveguides used in FCSELs are monostructural (i.e., formed into a single shape from a single material) polyhedrons that tend to be geometrically complex, but structurally simply, as opposed to the previously mentioned quarterwave mirror stack assemblies 24 (FIG. 3) used in prior-art VCSELs, which are geometrically simple, but structurally complex, and comprised as multilayered structures having a multitude of thin-film planar-flat plates constructed from materials with alternate refractive indices.

Moreover, a FCSEL's monostructural polyhedral prism waveguide 34, 43, 46 when constructed from Quartz or (SiO2) "Fused Silicon-Dioxide" are inexpensive to manufacture, are moisture resistant, are heat resistant, are non-conducting, and are easy to use in the construction of the before mentioned FCSELs. The previously mentioned (SiO2) "Fused Silicon-Dioxide" material is amorphous (i.e., a material made up of molecules that lack a distinct crystalline structure); therefore the material also has an absolute lattice-mismatch to semiconductors like (GaAs) "Gallium-Arsenide" and (AlGaAs) "Aluminum-Gallium-Arsenide, and to other Zinc-blend semiconductor materials, as well, which tends to promote a greater reflectivity at the material interface that lies between the FCSEL's first contact layer 35 (FIG. 9) and the FCSEL's polyhedral prism waveguide 34, 43, 46.

In addition, a FCSEL's (SiO2) "Fused Silicon-Dioxide" polyhedral prism waveguide would also be optically transparent, optically transmitting, and optically reflective totally to all intra-cavity optical radiation with wavelengths ranging from the very-short "150" nanometers of ultraviolet radiation to the very-long "5000" nanometers of infrared radiation. Moreover, remembering that, it is the before mentioned polyhedral prism waveguide's monostructural geometry that gives it the ability to internally redirect all optical radiation entering its plane-parallel, flat-horizontal, and circular top front-face surface 34C (FIG. 16), 43C (FIG. 14), 46B (FIG. 18).

Furthermore, the FCSEL design increases its modal discrimination by extending its optical-cavity length using the polyhedral prism waveguide as the means. The previously mentioned polyhedral prism waveguide, because it lengthens a FCSEL's optical-cavity, works by increasing the diffraction loss for its higher-order transverse optically moded light; thus increasing gain for its fundamental and lower-order transverse optically moded light. Therefore, by replacing the bottom positioned multilayered quarterwave mirror stack assembly, so typical of VCSEL designs, with a polyhedral prism waveguide we increase the output for its fundamental single-transverse optically moded light emission to nearly 7-mW.

Figure 13:
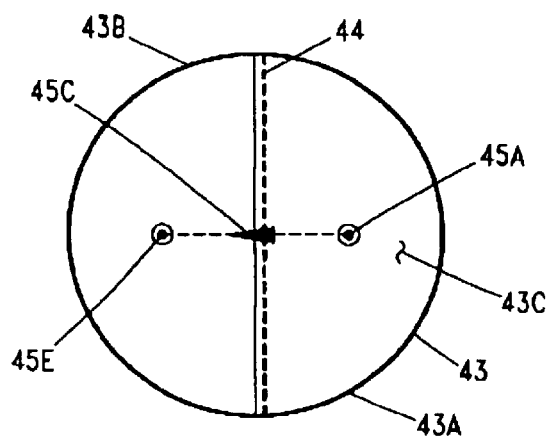
FIG. 13 shows an orthographic plan-view of the present invention's right-angle shaped polyhedral prism waveguide, while displaying the raytraced pathway of an internally reflected light-ray.
Figure 14:
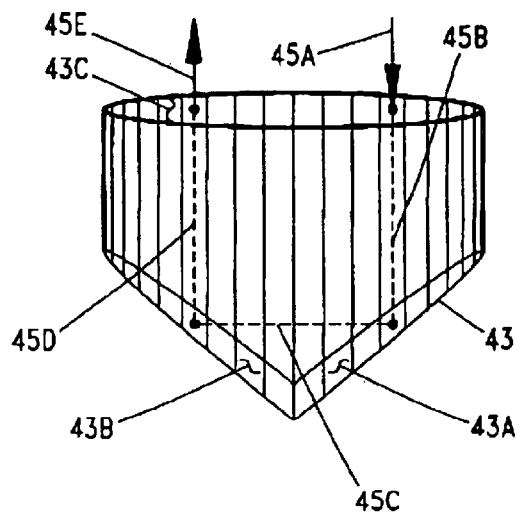
FIG. 14 shows a three-dimensional isometric top side-view of the present invention's right-angle shaped polyhedral prism waveguide, while displaying the raytraced path of an internally reflected light-ray.
Figures 17, 18:
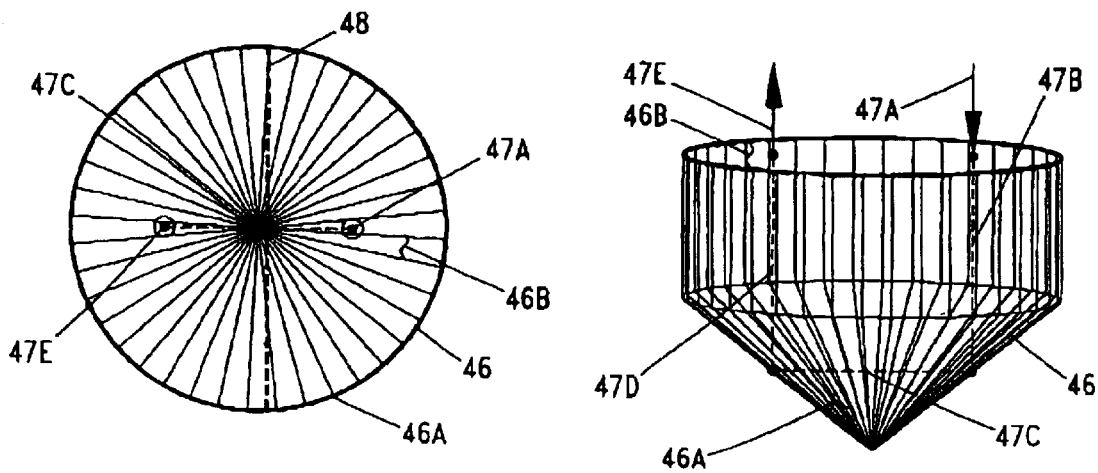
FIG. 17 shows an orthographic plan-view of the present invention's conical shaped polyhedral prism waveguide, while displaying the raytraced path of an internally reflected light-ray.
FIG. 18 shows a three-dimensional isometric top side-view of the present invention's conical shaped polyhedral prism waveguide, while displaying the raytraced path of an internally reflected light-ray.

Additional embodiments as illustrated in FIGS. 13, 14, 17, and 18 show two different embodiments of a FCSEL's polyhedral prism waveguide which, if comprised of Quartz or (SiO2) "Fused Silicon-Dioxide" (i.e., sometimes called fused silica) material, will reflect internally a "100" percent any wavelength of optical radiation entering its plane-parallel, flat horizontal, and circular top front-face surface 34D (FIG. 16), 43C (FIG. 14), 46B (FIG. 18). The first additional embodiment as illustrated in FIG. 13 and FIG. 14 shows a FCSEL's right-angle prism shaped polyhedral prism waveguide. Whereby, FIG. 14 (i.e., an isometric three-dimensional-view) displays an isometric three-dimensional-view of a FCSEL's right-angle prism shaped polyhedral prism waveguide 43 along with a raytraced pathway for an incoming 45A and outgoing 45E light-ray incidental upon the right-angle prism shaped polyhedral prism waveguide's plane-parallel, flat horizontal, and circular top front-face surface 43C (FIG. 14).

In addition, FIG. 13 (i.e., an orthographic top plan-view) displays an orthographic plan-view of a FCSEL's right-angle prism shaped polyhedral prism waveguide 43 and raytraced pathway for an incoming 45A and outgoing 45E light-ray incidental upon of the FCSEL's right-angle prism shaped polyhedral prism waveguide's top plane-parallel, flat horizontal, and circular front-face surface 43C (FIG. 13). The main function of illustrations FIG. 13 and FIG. 14 is to describe through the use of two simple geometric diagrams how light-rays 45 (FIG. 13), (FIG. 14) when they enter a FCSEL's right-angle prism shaped polyhedral prism waveguide's plane-parallel, flat horizontal, and circular top front-face surface 43C (FIG. 13), (FIG. 14) are internally reflected a "180" degrees backwards toward their originating light source 45E (FIG. 13).

Moreover, when the before mentioned light-ray 45A (FIG. 14) enters the plane-parallel, flat horizontal, and circular top front-face surface 43C (FIG. 13) of a FCSEL's right-angle prism shaped polyhedral prism waveguide 43 it will first travel to one of the right-angle prism shaped polyhedral prism waveguide's two internal polyhedral prism facet-faces, which are located at the bottom of the right-angle prism shaped polyhedral prism waveguide 43A, 43B (FIG. 13), (FIG. 14), where it 45B (FIG. 13), (FIG. 14) will be redirected 45C (FIG. 13), (FIG. 14) a "100" percent into a "90" degree transverse direction from a first internal polyhedral prism facet-face 43A (FIG. 13), (FIG. 14) to a second internal polyhedral prism facet-face 43B (FIG. 13), (FIG. 14), where it will be redirected 45D (FIG. 13), (FIG. 14) a "100" percent into a "90" degree longitudinal direction up and out of the plane-parallel, flat horizontal, and circular top front-face surface 45D (FIG. 13), (FIG. 14) of the right-angle prism shaped polyhedral prism waveguide backwards into the FCSEL's vertical cavity 45E (FIG. 13), (FIG. 14) for further amplification. The second additional embodiment as illustrated in FIGS. 17, and 18 shows a conical shaped polyhedral prism waveguide 46 which, if comprised of Quartz or (SiO2) "Fused Silicon-Dioxide" (i.e., sometimes called fused silica) material, will reflect internally a "100" percent any wavelength of optical radiation entering its plane-parallel, flat horizontal, and circular top front-face surface 46B (FIG. 17).

Furthermore, FIG. 17 (i.e., an isometric three-dimensional-view) displays an isometric three-dimensional-view of a FCSEL's conical shaped polyhedral prism waveguide 46 along with a raytraced pathway for an incoming 47A and outgoing 47E light-ray that is incidental upon the conical shaped polyhedral prism waveguide's plane-parallel, flat horizontal, and circular top front-face surface 46B (FIG. 17).

In addition, FIG. 18 (i.e., an orthographic top plan-view) displays an orthographic plan-view of a FCSEL's conical shaped polyhedral prism waveguide 46 along with a ray-traced pathway for an incoming 47A and outgoing 47E light-ray that is incidental upon of the conical shaped polyhedral prism waveguide's top plane-parallel, flat horizontal, and circular front-face surface 46B (FIG. 18). The main function of illustrations FIG. 17 and FIG. 18 is to describe, through the use of two simple geometric diagrams, how light-rays 47 (FIG. 17), (FIG. 18) when they enter a FCSEL's conical shaped polyhedral prism waveguide's plane-parallel, flat horizontal, and circular top front-face surface 36B (FIG. 17), (FIG. 18) are internally reflected a "180" degrees backwards toward their originating light source 47E (FIG. 17), (FIG. 18).

Moreover, when the previously mentioned light-ray 47A (FIG. 17), (FIG. 18) enters the plane-parallel, flat horizontal, and circular top front-face surface 46B (FIG. 17), (FIG. 18) of a FCSEL's conical shaped polyhedral prism waveguide 46 (FIG. 17), (FIG. 18) it will first travel to the conical shaped polyhedral prism waveguide's curved polyhedral prism facet-face 46A (FIG. 17), (FIG. 18), which is located at the conical shaped polyhedral prism waveguide's bottom 46A (FIG. 17), (FIG. 18), where it 47B (FIG. 17), (FIG. 18) will be redirected 47C (FIG. 17), (FIG. 18) a "100" percent into a "90" degree transverse direction from the curved internal polyhedral prism facet-face 46A (FIG. 17), (FIG. 18) to the other side of the curved internal polyhedral prism facet-face 46A (FIG. 17), (FIG. 18), where it will be redirected 47D (FIG. 17), (FIG. 18) a "100" percent into a "90" degree longitudinal direction up and out of the FCSEL's conical shaped polyhedral prism waveguide's plane-parallel, flat horizontal, and circular top front-face surface 46B (FIG. 17), (FIG. 18), backwards into the FCSEL's vertical cavity for further amplification.

An additional embodiment of the present FCSEL invention, as illustrated in FIGS. 7, 8, 9, 13, 14, 15, 16, 17, 18, and 20 is the material distribution process for the polyhedral prism waveguides 34, 43, 46. If constructed from (SiO2) "Fused Silicon-Dioxide", the previously mentioned polyhedral prism waveguide is to be sputter deposited onto the bottom and outermost surface of the FCSEL's first +n-doped (GaAs) "Gallium-Arsenide" crystalline semiconductor contact-layer 35 (FIG. 9), while its top and outermost surface will be used as a crystal growing substrate for the growing of the FCSEL's remaining crystalline semiconductor structures, while using MBE or MOCVD as a epitaxial method of layer deposition.

Furthermore, the reason why the top and outermost surface of a FCSEL's first +n-doped (GaAs) "Gallium-Arsenide" crystalline semiconductor contact-layer 35 is used as the crystal growing substrate for growing the FCSEL's remaining crystalline semiconductor structures is that even though the polyhedral prism waveguides are deposited at the very bottom of a FCSEL's optical cavity they cannot be used as crystal growing substrates. Moreover, because (SiO2) "Fused Silicon-Dioxide" the dielectric material used in the construction of a FCSEL's polyhedral prism waveguides is amorphous it could never be used to grow the FCSEL's succeeding layers of crystalline semiconductor materials.

To explain this further, (SiO2) "Fused Silicon-Dioxide" can never be used as a growth substrate for a MBE or MOCVD epitaxial deposition of a FCSEL's succeeding layers of crystalline semiconductor materials because, during the process of MBE or MOCVD deposition, a deposited material, during its growth will take on the same crystalline or non-crystalline molecular structure that is exhibited by its crystal growing substrate. Consequently, because a FCSEL's polyhedral prism waveguides 34 (FIG. 16), 43 (FIG. 14), 46 (FIG. 18) are made from (SiO2) "Fused Silicon-Dioxide", then any crystalline semiconductor material, if epitaxially deposited upon its amorphous structure would, also during its growth acquire the (SiO2) "Fused Silicon-Dioxide" material's amorphous non-crystalline form and because the FCSEL's succeeding layers need to have crystalline structures to function (SiO2) "Fused Silicon-Dioxide" is useless as a material used in the crystal growing production of double-heterostructure light emitting diodes, crystalline quarterwave mirror stacks, and other crystalline structures that might be used to control the polarization, modulation, and frequency of the FCSEL's output laser emissions.

Furthermore, the distribution of (SiO2) "Fused Silicon-Dioxide", if used in the construction of a FCSEL's polyhedral prism waveguides 34 (FIG. 15), (FIG. 16), 43 (FIG. 13), (FIG. 14), 46 (FIG. 17), (FIG. 18), would be done through a well known sputtering process onto the bottom and outermost planar-flat surface that underlies the FCSEL's first contact-layer 35 (FIG. 9) and crystal growing substrate of +n-doped binary (GaAs) "Gallium-Arsenide" material. For example, a layer of (SiO2) "Fused Silicon-Dioxide" material, approximately "1000" nanometers thick, is sputter deposited onto the bottom and outermost surface of a FCSEL's before mentioned first contact-layer 35 (FIG. 7) and crystal growing substrate of +n-doped binary (GaAs) "Gallium-Arsenide" material. Afterwards, lithography processes are used to remove the excess (SiO2) "Fused Silicon-Dioxide" material that surrounds a FCSEL's polyhedral prism waveguide(s), revealing therein a cylindrical shaped base-structure(s).

In addition, a well known ion-milling process is employed to slice out the polyhedral prism waveguide's 34 (FIG. 15), (FIG. 16), 43 (FIG. 13), (FIG. 14), 46 (FIG. 17), (FIG. 18) prism facets, while a material like (LiF) "Lithium-Fluoride" for a cladding layer 40 (FIG. 9), having a very low index of refraction is deposited, using a well known sputtering process, around the FCSEL's (SiO2) "Fused Silicon-Dioxide" polyhedral prism waveguide(s). If necessary the (LiF) "Lithium-Fluoride" 40 (FIG. 9) cladding material can be partially removed later using a well-known ion-milling process; leaving the polyhedral prism waveguide's facets uncovered. Moreover, an amorphous form of (LiF) "Lithium-Fluoride" cladding material 40 (FIG. 9) is used by a FCSEL's optical cavity as an optical cladding material, which also adds additional support and structural strength to the FCSEL's polyhedral prism waveguide(s) 34 (FIG. 15), (FIG. 16), 43 (FIG. 13), (FIG. 14), 46 (FIG. 17), (FIG. 18) as well.

Furthermore, it should be understood that within each FCSEL device the thickness and doping levels of dopants within each layer is precisely controlled. Any deviation from a FCSEL's designed parameters, no matter how slight, would affect the FCSEL's performance (i.e., frequency range and flux intensity). For example, if a FCSEL device were designed to emit laser light at a wavelength of "800" nanometers, then the thickness of each alternating layer, used in the FCSEL's quarterwave mirror-stack assembly 38 (FIG. 9) would each, need to equal one quarter of one wavelength of the fundamental "800" nanometer light produced by the FCSEL's active-region. The doping of a FCSEL's multi-layered structures is accomplished during epitaxial deposition by the addition of various dopant materials (e.g., n-type electron donating dopants like Phosphorus and p-type electron accepting dopants like Boron) to construction materials used in the MBE or MOCVD epitaxial deposition of layers. A FCSEL laser device will use many different dopant concentrations of specific dopant materials within the several different extrinsic semiconductor layers that comprise the FCSEL's various multi-layered structures.

An additional embodiment of the present FCSEL invention, as illustrated by FIGS. 7, 8, and 9, shows how the FCSEL laser diode is configured as a single laser-diode device. For example, a FCSEL would be configured as a single laser-diode device, when used in applications like:

(i) In (AV) "Audio Video" record/playback multi-media recorders.

(ii) In (DVD) "Digital Video Disk" players.

(iii) In (CD) "Compact Disk" players.

(iv) In (WORM) "Write Once Read Many" data-storage devices constructed using single FCSEL lasers.

(v) In (MPEG) "Motion Picture Expert Group" compact disk players and recorders constructed using single FCSEL lasers.

(vi) In (MD) "Mini Disk" magneto-optical record/playback recorders.

(vii) In rear-projection big-screen television.

(viii) In magneto-optical flying-head data-storage hard disk drives.

(ix) In (DVD) "Digital Video Disk" ram-disk data-storage drives.

(x) In (MO) "Magneto Optical" removable disk drive mass-storage.

(xi) In short and long-haul fiber-optic communication transmitters.

Figure 10:
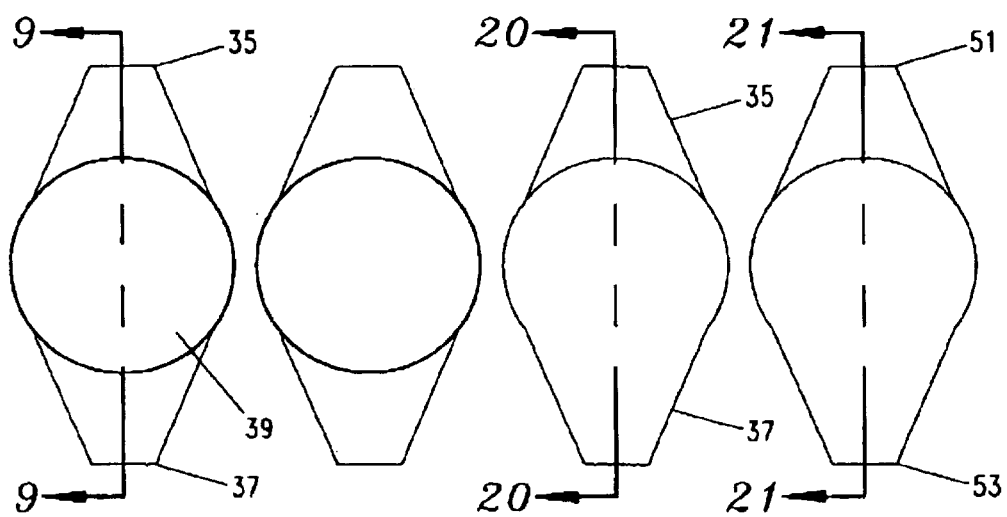
FIG. 10 shows the present invention, illustrated as an orthographic plan-view of a linear array of two FCSELs and two FCSEL active-regions that display section lines 9—9, 20—20, and 21—21.
Figure 11:
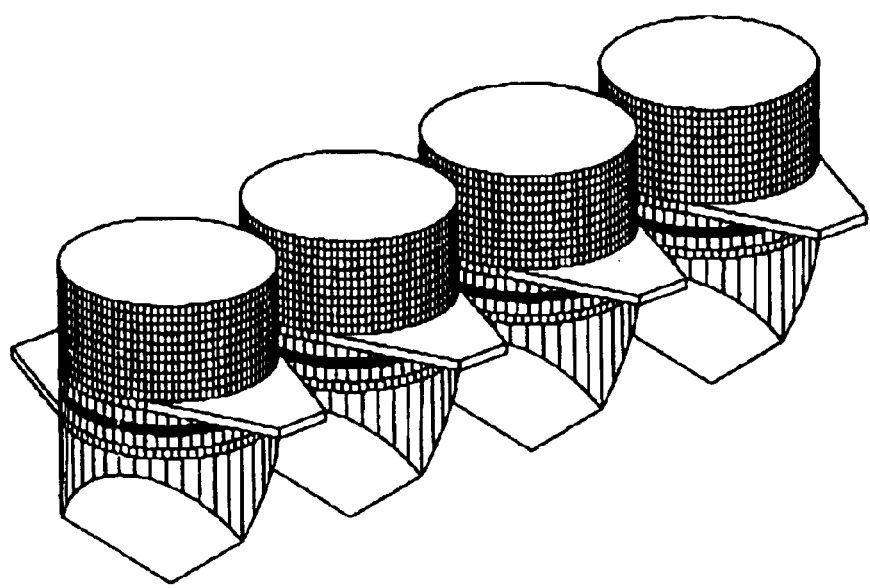
FIG. 11 shows the present invention, illustrated as a three-dimensional isometric top-right view of four FCSELs shown in a linear array configuration.
Figure 12:
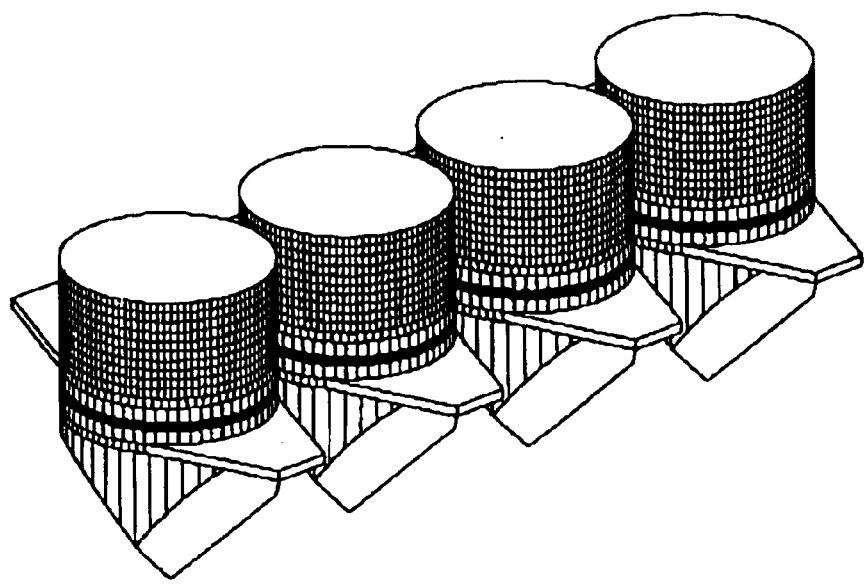
FIG. 12 shows the present invention, illustrated as a three-dimensional isometric top-left view of four FCSELs shown in a linear array configuration.

An additional embodiment of the present FCSEL invention as illustrated by FIGS. 10, 11, and 12 shows the FCSEL's configuration as a laser-array device. For example, a FCSEL could be configured as a laser-array device for use in hardware applications like:

(i) In optically pumped solid-state lasers using a FCSEL laser-array.

(ii) In video-display micro-screens using a FCSEL laser-array.

(iii) In flat-bed and hand-held scanners using a FCSEL laser-array.

(iv) In laser printers using a FCSEL laser-array.

An additional embodiment of the present FCSEL invention describes how FCSELs illustrated by FIGS. 10, 11, and 12 are configured into laser-arrays that can be manufactured at the same time and from the same binary (GaAs) "Gallium-Arsenide" semiconductor substrate material that is used to construct the laser-array's control-circuitry, all of which, would be contained within a single laser-array device. While the FCSELs within a single laser-array device are configured, as either singularly controlled and addressable lasers, or a single laser-array device configured and controlled as a single unit of multiple lasers (i.e., a laser-array). The electronic control over both a single FCSEL laser device or individual FCSEL laser devices located within a single FCSEL laser-array is easily accomplished through a (GaAs) "Gallium-Arsenide" semiconductor based control-bus, memory-bus, and address-bus form of circuitry, all of which, are semiconductor circuits created from and contained on the same semiconductor substrate material used to create the before mentioned FCSEL lasers themselves. To explain further, (GaAs) "Gallium-Arsenide" circuitry can be created, along with the before mentioned FCSEL laser devices, from the same binary (GaAs) "Gallium-Arsenide" semiconductor substrate material. Integrating the before mentioned FCSEL devices, along with the before mentioned control circuitry, into a single surface mountable integrated semiconductor chip device.

An additional embodiment of the present FCSEL invention as illustrated by FIG. 9 shows the addition of a cladding material 40 to the vertical and outermost wall surfaces of the FCSEL's vertical cavity, or cavities, where the cladding material 40 has a refractive index less than the semiconductor crystalline materials used in the construction of its before mentioned vertical cavity. A cladding material 40 (FIG. 9) is to be deposited around and between every lithographically etched FCSEL; surrounding every FCSEL's outermost wall-surface with an internal reflectivity that is "100" percent for any intracavity traveling light-ray, but only if the light-ray's angle of incidence upon the cladding-layer's 40 innermost wall surface has an internal angle of incidence equal to or greater than what is normally termed as the critical angle of internal reflection. For example, the deposition of (LiF) "Lithium-Fluoride" for the cladding layer 40 (FIG. 9), an optical material possessing a much lower refractive index than the binary (GaAs) "Gallium-Arsenide", and the ternary (GaAlAs) "Gallium-Aluminum-Arsenide" materials used in the construction of a FCSEL's vertical cavity; wherein, the previously mentioned (LiF) "Lithium-Fluoride" is used as an optical cladding material that is sputter deposited onto and around the outermost wall surfaces of the FCSEL's vertical cavity; excluding the FCSEL's "200" nanometers thick "Calcite" emitter layer 39 (FIG. 7) which, being the last deposited layer in the FCSEL device is located at the very top of the FCSEL's before mentioned quarterwave mirror stack assembly 39 (FIG. 9). The before mentioned deposition of cladding material to a FCSEL's outer-most wall surface will give added stability to the FCSELs and their polyhedral prism waveguides, while helping to achieve a total internal reflectivity for the FCSEL device(s). The introduction of vertically applied internal reflectivity will help reduce optical loses to a FCSEL's optical cavity; wherein, the previously mentioned optical loses are caused by planar-mirror light-scattering and planar-mirror diffraction scattering.

Moreover, the application of cladding materials 40 like (LiF) "Lithium-Fluoride" to the optical cavities of FCSELs (FIG. 9), will create between the optical cavities of FCSELs and the previously mentioned optical cladding material, an internal reflecting optical-barrier, which will confine to a FCSEL's optical cavity, diode produced fundamental light. This process works in much the same way as fiber-optic technology does; wherein, an optical cladding material, having an lower refractive index than the material used within an optical fiber's core is deposited onto the outermost surface walls of that optical fiber's core, will achieve, "100" percent, a total internal reflectivity for any intra-fiber traveling light-ray whose angle of incidence upon the innermost wall surface of optical-fiber's cladding-layer has an internal angle of incidence equal to or greater than what is normally termed as the critical angle of internal reflection.

Figure 21:
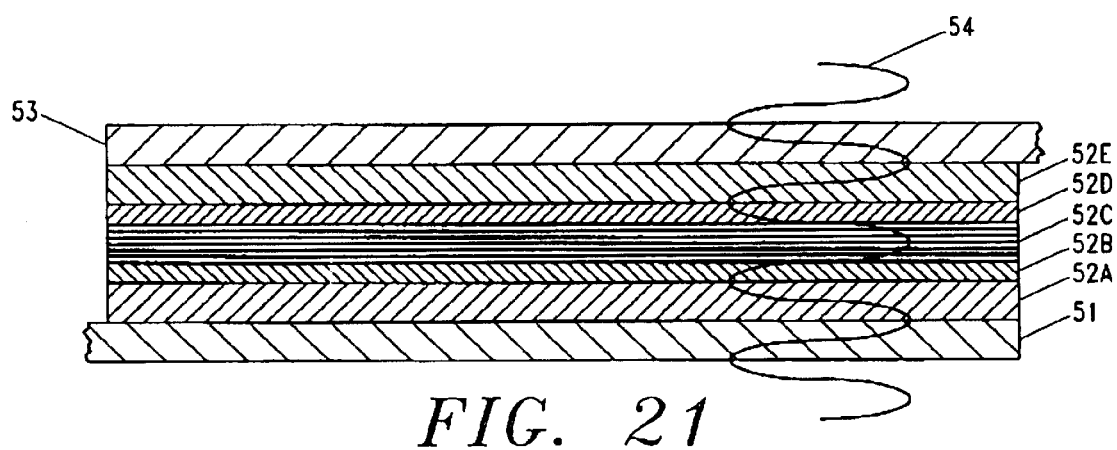
FIG. 21 shows a close-up side-view of a vertical section of a typical double-heterostructure active-region, shown as additional embodiment displaying two primary un-graded confinement cladding-layers, the two secondary confinement heterostructure cladding-layers, and the active-area comprising a multiple quantum-well of the active-region.

An alternative embodiment to the present FCSEL invention, as illustrated in FIG. 21 shows an alternative embodiment to the double-heterostructure light emitting diode design previously described in the preferred embodiment above. The alternative embodiment being also of a double-heterostructure diode design, which is alternatively configured as an active-region 52 (FIG. 21) that comprises a (MQW) "Multiple Quantum Well" active-area 52C (FIG. 21), but is also shown as having two primary contra-positioned non-graded confinement cladding-layers 52A, 52E (FIG. 21), two contra-positioned non-graded (SCH) "Separate Confinement Heterostructure" cladding-layers 52B, 52D (FIG. 21), one positive contact-layer 53 (FIG. 21), and one negative contact-layer and crystal growing substrate 51 (FIG. 21).

Furthermore, the alternative embodiment to the present FCSEL invention, as illustrated in FIG. 21 shows a double-heterostructure light emitting diode design whose order of layered deposition begins with the creation of a first "200" nanometers thick contact-layer 51 (FIG. 21), which is formed from a pre-manufactured and pre-sliced semiconductor wafer that was comprised from a seed crystal of highly +n-doped (GaAs) "Gallium-Arsenide" binary material having a crystallographic orientation of <100>, <111>, <110>, or <001>, and used as the main substrate for the subsequent growth of the remaining crystalline semiconductor layers that make-up the diode's structure.

Moreover, an alternative FCSEL diode's first contact-layer 51 (FIG. 21), while providing negative electrical connectivity to the alternative FCSEL diode's light emitting active-region 52 (FIG. 21) will also enhance the reliability of the alternative FCSEL diode's design, by preventing the migration of carrier-dislocations, and the like, to the alternative FCSEL diode's active-area 52C (FIG. 21).

In addition, the alternative embodiment of the present FCSEL invention, as illustrated in FIG. 21 shows a first "200" nanometers thick primary non-graded confinement cladding-layer 52A (FIG. 21), which is deposited, using MBE or MOCVD, onto the top and outermost surface of the alternative FCSEL diode's first contact-layer 51, giving it a deposited position between the alternative FCSEL diode's first contact-layer 51 and the alternative FCSEL diode's first non-graded SCH cladding-layer 52B (FIG. 21). The alternative embodiment of the present FCSEL invention, as illustrated in FIG. 21 shows that the first "200" nanometers thick primary non-graded confinement cladding-layer 52A (FIG. 21) that comprises an N-doped (AlGaAs) "Aluminum-Gallium-Arsenide" ternary semiconductor material.

In addition, the alternative embodiment to the present FCSEL invention, as illustrated in FIG. 21 shows a first "100" nanometers thick non-graded SCH cladding-layer 52B (FIG. 21) that comprises a n-doped (GaAlAs) "Gallium-Aluminum-Arsenide" ternary semiconductor material which is deposited, using MBE or MOCVD, onto the top and outermost surface of the alternative FCSEL diode's first primary non-graded confinement cladding-layer 52A (FIG. 21), giving it a deposited position between the alternative FCSEL diode's first primary non-graded confinement cladding-layer 52A and the alternative FCSEL diode's active-area 52C (FIG. 21). An alternative FCSEL diode's first "100" nanometers thick non-graded SCH cladding-layer 52B is made from a material having an refractive index that is between the refractive index of the multiple quantum wells that make-up the alternative FCSEL diode's active-area 52 and the refractive index of the material used to construct the alternative FCSEL diode's first primary non-graded confinement cladding layers 52A (FIG. 21).

In addition, the alternative embodiment of the present FCSEL invention, as illustrated in FIG. 21, shows that next in line for material deposition is a active-area 52C (FIG. 21) that constitutes the FCSEL's active medium which, through a process of stimulated emission, produces additional light when the previously mentioned active medium is optically pumped by intracavity confined light created by the population inversion occurring within the alternative FCSEL diode's active-area 52C (FIG. 21), which is a MQW 52 (FIG. 21) structure located within the alternative FCSEL diode's active-region.

In addition, the alternative embodiment of the present FCSEL invention, as illustrated in FIG. 21, shows that the previously mentioned active-area 52C is a multi-layered MQW structure 52C (FIG. 21) that is positioned between the alternative FCSEL's first and second non-graded SCH confinement cladding-layers 52B, 52D (FIG. 21), which comprises seven quantum wells 49A, 49B, 49C, 49D, 49E, 49F, 49G (FIG. 20-A) that are constructed using a binary (GaAs) "Gallium-Arsenide" semiconductor material having a small forbidden bandwidth, and six quantum well cladding-layers 50A, 50B, 50C, 50D, 50E, 50F (FIG. 20-A) that are constructed using a ternary (GaAlAs) "Gallium-Aluminum-Arsenide" semiconductor material having a very large forbidden bandwidth. All thirteen of the previously mentioned semiconductor layers that make up an alternative FCSEL's active-area 52C (FIG. 21), when combined, form a MQW having a combined material thickness that is one-quarter of one wavelength of the fundamental light emission created by the alternative FCSEL's active-region 52 (FIG. 21). For example, if an alternative FCSEL's active-region 52 (FIG. 21) were designed to create light with a fundamental wavelength of "800" nanometers the alternative FCSEL's active-area 52C total material thickness would need to be one-quarter (i.e., "200" nanometers) of one wavelength of the fundamental "800" nanometer light that was created by the alternative FCSEL's active-region 52.

Furthermore, if an alternative FCSEL's active-area 52C (FIG. 21), as shown in FIG. 20-A, had seven quantum wells 49A, 49B, 49C, 49D, 49E, 49F, 49G comprised of binary (GaAs) "Gallium-Arsenide" semiconductor material, the before mentioned seven quantum wells would each need to have a material thickness of about "10.30" nanometers. In addition, if an alternative FCSEL's active-area 52C had six quantum well cladding-layers 50A, 50B, 50C, 50D, 50E, 50F (FIG. 20-A) comprised of ternary (GaAlAs) "Gallium-Aluminum-Arsenide" semiconductor material, the before mentioned six quantum well cladding-layers would each need to have a material thickness of about "21.30" nanometers. The thickness amounts for each of the seven quantum wells and six quantum well cladding-layers located within the alternative FCSEL's active-area 52C, when combined, should have a total material thickness equal to "200" nanometers or one-quarter of one wavelength of the fundamental "800" nanometer light created by the alternative FCSEL's active-region 52 (FIG. 21).

In addition, the alternative embodiment of the present FCSEL invention as illustrated in FIG. 21 shows an alternative FCSEL diode's MQW structure, from the energy standpoint, as being diagrammatically characterized (FIG. 19). More specifically, FIG. 19 illustrates the profile of the potential wells and the discreet energy levels assumed by the carriers respectively in the conduction and valency bands (i.e., respectively electrons and holes). When, an epitaxy, semiconductor film with a small forbidden band e2 (e.g., film with a typical thickness of about ten nanometers), such as films 49A, 49B, 49C, 49D, 49E, 49F, 49G (FIG. 20-A), which are surrounded by two films with a larger forbidden band e0 (e.g., film with a typical thickness of about twenty nanometers), such as films 50A, 50B, 50C, 50D, 50E, 50F (FIG. 20-A), the previously mentioned electrons and holes of the small forbidden band material 49A, 49B, 49C, 49D, 49E, 49F, 49G (FIG. 20-A) are confined in monodirectional potential wells e2.

Moreover, as illustrated in FIG. 19, the movement of an electron into a well created in the conduction band of height ΔE$_c$ is quantified in discreet states of energy E$_1$, E$_2$, E$_3$, etc.; moreover in the same way, the movement of a hole into a well created in the valency band of height ΔE$_x$ is quantified in discreet states of energy E'$_1$, E'$_2$, and E'$_3$. When the thickness of the small forbidden bandwidth material e2 varies, the energy states assumed by the carriers also vary. Therefore, the emission length of the previously mentioned MQW structures can consequently be adjusted by the choice, the nature, and the thickness of the semiconductor material films used in their construction.

In addition, the alternative embodiment to the present FCSEL invention, as illustrated in FIG. 21, shows that next in line for deposition is a second "100" nanometers thick non-graded SCH cladding-layer 52D that comprises a p-doped (GaAlAs) "Gallium-Aluminum-Arsenide" ternary semiconductor material which is deposited, using MBE or MOCVD, onto the top and outermost surface of the alternative FCSEL diode's active-area 52C (FIG. 21), giving it a deposited position between and the alternative FCSEL diode's active-area 52C and the alternative FCSEL diode's second primary non-graded confinement cladding-layer 52E (FIG. 21). An alternative FCSEL diode's second "100" nanometers thick non-graded SCH cladding-layer 52D is to be made from a material having an refractive index between the refractive index of the alternative FCSEL diode's multiple quantum wells and the refractive index of the material that is used to construct the alternative FCSEL diode's second primary non-graded confinement cladding layers 52E (FIG. 21).

In addition, the alternative embodiment to the present FCSEL invention, as illustrated in FIG. 21, shows that next in line for deposition is an alternative FCSEL diode's second "200" nanometers thick primary non-graded confinement cladding-layer 52E, which is epitaxially deposited, using MBE, MOVPR, or MOCVD onto the top and outermost surface of the alternative FCSEL diode's second "100" nanometers thick non-graded SCH cladding-layer 52D (FIG. 21). Giving it a deposited position between the alternative FCSEL diode's second "100" nanometers thick non-graded SCH cladding-layer 52D and the alternative FCSEL diode's second contact-layer 53 (FIG. 21). The alternative embodiment of the present FCSEL invention as illustrated in FIG. 21 shows that the second "200" nanometers thick primary non-graded confinement cladding-layer 52E (FIG. 21) that comprises a P-doped (AlGaAs) "Aluminum-Gallium-Arsenide" ternary semiconductor material.

In addition, the alternative embodiment to the present FCSEL invention, as illustrated in FIG. 21, shows next in line for deposition is an alternative FCSEL diode's second "200" nanometers thick contact-layer 53 that comprises a highly +p-doped (GaAs) "Gallium-Arsenide" binary semiconductor material, which is epitaxially grown onto the top and outermost surface of the alternative FCSEL diode's second primary non-graded confinement cladding-layer 52E (FIG. 21). The alternative embodiment to the present FCSEL invention as illustrated in FIG. 21 shows that the second "200" nanometers thick contact-layer 53 (FIG. 21), while providing positive electrical connectivity to the alternative FCSEL diode's active-region 52 (FIG. 21) will also enhance the reliability of the alternative FCSEL diode's laser design, by preventing the migration of carrier-dislocations, and the like, to the alternative FCSEL diode's active-area 52C (FIG. 21).

Furthermore, the alternative embodiment to the present FCSEL invention as illustrated in FIG. 21 shows a standing wave 54 (FIG. 21) plotted across the alternative embodiment double-heterostructure diode's structure, where the standing wave's peak crest as being centered onto the center of the alternative FCSEL diode's active-area 52C (FIG. 21) illustrating an properly designed active-region. For example, an alternative FCSEL diode's active-region, as illustrated in FIG. 21, when comprised of two contra-propagating "100" nanometers thick non-graded SCH cladding-layers 52B, 52D, and an active-area "200" nanometers thick 52C (FIG. 21), layers equaling a total material thickness of "400" nanometers or one-half of one wavelength of the fundamental "800" nanometer light that is generated by the alternative embodiment diode's active-region, would be centered, as illustrated in FIG. 21, on a propagating standing wave's crest; thus generating optimal gain for the output emission of stimulated emission generated light.

From the description above, a number of advantages of various embodiments of the present invention become evident:

The total elimination, along with the manufacturing processes associated with their construction, of what is typically known in prior-art VCSEL design as the first quarterwave mirror stack assembly, or as the base quarterwave mirror stack reflector, which is replaced, as illustrated in FIGS. 7, 8, and 9, by the present inventions polyhedral prism waveguide 34, 43, 46.

The use of a polyhedral prism waveguide, which is located at the base of the present invention's vertical cavity, replaces the more conventional metallic alloy and/or sapphire substrates and/or the planar-flat multilayered quarterwave mirror stack assemblies 22, 23 (FIG. 1), (FIG. 2), (FIG. 3) normally used in prior-art VCSEL designs, with a single layered monolithic structure that will transmit all frequencies of optical radiation.

The polyhedral prism waveguides used in the present invention are monostructural (i.e., formed into a single shape from a single material) polyhedrons, which are geometrically complex, but structurally simply, as opposed to quarterwave mirror stacks used in prior-art VCSELs, which are geometrically simple, but structurally complex, and comprised as multilayered structures having a multitude of thin-film planar-flat plates constructed from materials with alternate refractive indices.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is inexpensive to manufacture.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is moisture resistant.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is heat resistant.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is non-conducting.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is easy to use in the construction of the present invention.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is amorphous (i.e., a material made up of molecules that lack a distinct crystalline structure); therefore the material has an absolute lattice-mismatch to diode constructing semiconductor materials like (GaAs) "Gallium-Arsenide" and (AlGaAs) "Aluminum-Gallium-Arsenide, and to other Zinc-blend semiconductor materials, as well. Moreover, this tends to promote a greater reflectivity at the material interface between the FCSEL's first contact layer 35 (FIG. 9) and the FCSEL's polyhedral prism waveguide.

The present invention's monostructural polyhedral prism waveguide 34 (FIG. 15), (FIG. 16), 43 (FIG. 13), (FIG. 14), 46 (FIG. 17), (FIG. 18), when constructed from Quartz or (SiO2) "Fused Silicon-Dioxide", is optically transparent to optical radiation with wavelengths ranging from the very-short "150" nanometers of ultraviolet radiation to the very-long "5000" nanometers of infrared radiation.

The present invention's monostructural polyhedral prism waveguide 34 (FIG. 15), (FIG. 16), 43 (FIG. 13), (FIG. 14), 46 (FIG. 17), (FIG. 18) when constructed from Quartz or (SiO2) "Fused Silicon-Dioxide" will optically transmit optical radiation with wavelengths ranging from the very-short "150" nanometers of ultraviolet radiation to the very-long "5000" nanometers of infrared radiation.

The present invention's monostructural polyhedral prism waveguide 34 (FIG. 15), (FIG. 16), 43 (FIG. 13), (FIG. 14), 46 (FIG. 17), (FIG. 18) when constructed from Quartz or (SiO2) "Fused Silicon-Dioxide" is also totally and internally reflecting to optical radiation with wavelengths ranging from the very-short "150" nanometers of ultraviolet radiation to the very-long "5000" nanometers of infrared radiation.

The present invention's monostructural polyhedral prism waveguide 34 (FIG. 15), (FIG. 16), 43 (FIG. 13), (FIG. 14), 46 (FIG. 17), (FIG. 18) has a monostructural geometry that gives it the ability to internally redirect a "180" degrees all optical radiation entering its plane-parallel, flat-horizontal, and circular top front-face surface 27C (FIG. 13), (FIG. 14), (FIG. 15), (FIG. 16) 36B (FIG. 18), (FIG. 19).

The present invention's monostructural polyhedral prism waveguide 34 (FIG. 15), (FIG. 16), 43 (FIG. 13), (FIG. 14), 46 (FIG. 17), (FIG. 18) will increase the present inventions modal discrimination by extending its optical-cavity length using the polyhedral prism waveguide as the means. Moreover, the previously mentioned polyhedral prism waveguide, because it lengthens a FCSEL's optical-cavity, works by increasing the diffraction loss for high-order transverse optical-modes therein, increasing gain for the FCSEL's fundamental and lower-order transverse optical-modes.

There are relative possibilities with regard to the present invention's choice of light emitting active-regions, one of which is the FCSEL's novel approach to a double-heterostructure semiconductor LED design 36 (FIG. 9) that is based upon a structural enhancement of its cladding-layer design, which effectively increasing the amount of recombined "electron/hole" radiation, or what is generally called "radiative recombination" that occurs within the FCSEL's active-region 36B (FIG. 9).

Furthermore, the present FCSEL invention, as illustrated in FIG. 9, effectively displays a sectional view of the FCSEL's many different layers of semiconductor and optical materials that are used in the FCSEL's construction. Moreover, the previously mentioned layers that are used to construct a FCSEL's double-heterostructure LED active-region, a FCSEL's polyhedral prism waveguide, and a FCSEL's quarterwave mirror stack assembly, are built-up, layer upon layer, using various epitaxial and sputter material deposition processes. For example, the layers of optical and semiconductor materials that make up a FCSEL device can be constructed by using widely excepted methods of material deposition like MBE, MOCVD, and/or Sputtering.

The present FCSEL invention, according to various embodiments, as illustrated in FIGS. 7, 8, and 9, is an index-guided semiconductor surface-emitting laser that has totally eliminated substrate positioned multilayered quarter-wave mirror-stack base-reflector assemblies typical of prior-art VCSEL design 24, 32 (FIG. 3), and replaced it with a single layered polyhedral shaped waveguide structure 34 (FIG. 16), 43 (FIG. 14), 46 (FIG. 18). However, regardless of any changes that might be made to a semiconductor laser's optical cavity, light amplifying processes via stimulated-emission can only occur within any semiconductor laser if fundamental light-waves produced by the laser's diode 28 (FIG. 3), 36 (FIG. 9) are made to oscillate between two light reflecting structures 24, 32 (FIG. 3), 34, 38 (FIG. 9) that are contra-positioned at both ends of an optical cavity's active-region 28 (FIG. 3), 36 (FIG. 9).

Moreover, the present FCSEL invention, according to various embodiments, as illustrated in FIGS. 7, 8, and 9, amplifies light via stimulated-emission when light-waves produced by its active-region 36 (FIG. 9) are made to oscillate between the previously mentioned light reflecting structures 34, 38 (FIG. 9). Consequently, as the previously mentioned oscillations occur light-waves pass through the previously mentioned optical cavity's active-region 36 (FIG. 9) and the multiple quantum well structures that make-up the active-region's active-area 36B (FIG. 9). However, in the present FCSEL invention the previously mentioned light-wave oscillations do not occur between two different contra-reflecting mirror structures located at opposite ends of an optical cavity's active-region 24, 32 as illustrated in FIGS. 1, 2, and 3, but occur only between a single light reflecting structure 38 (FIG. 9), which is located at only one end of an optical cavity's active-region 36 (FIG. 9).

For example, the present FCSEL invention, according to various embodiments, by replacing a substrate 22 (FIG. 3) positioned and total reflecting quarterwave mirror stack assembly 24 (FIG. 3) with a single total internal reflecting polyhedral prism waveguide 34 (FIG. 9), the optical cavity of the FCSEL is folded backwards a "180" degrees upon itself, where light-waves of fundamental light created by the FCSEL's active-region 36 (FIG. 9) are made to oscillate, using a folded optical cavity, back and forth, through the active-region's active-area 36B (FIG. 9), between a single partial light reflecting structure 38 (FIG. 9). The oscillating light-waves that occur within a FCSEL's folded optical cavity, while propagating through the FCSEL's polyhedral shaped prism waveguide 34 (FIG. 9), will have angles of incidence that are equal to or greater than the critical angle of internal reflection for the polyhedral prism waveguide's prism facets 34A, 34B, 34C, which are located at the base of every FCSEL polyhedral prism waveguide 34 (FIG. 16), 43 (FIG. 14), 46 (FIG. 18).

Moreover, oscillating light-waves 42A (FIG. 16) that propagate 42B in a direction away from the FCSEL's active-region 36 (FIG. 9) into the FCSEL's polyhedral prism waveguide 34 (FIG. 9) are ultimately turned and redirected by a prism facet 34A (FIG. 9) of the polyhedral prism waveguide 34 (FIG. 9) into a transverse horizontal direction 42C (FIG. 16) until they are turned and redirected again by a second prism facet 34B (FIG. 9), and a third prism facet 34C (FIG. 9) of the polyhedral prism waveguide 34, but into a longitudinal vertical direction 42E (FIG. 16) toward the FCSEL's active-region 36 (FIG. 9); wherein, oscillating light-waves 42F (FIG. 16) propagating toward the FCSEL's single light reflecting structure 38 (FIG. 9) will stimulate further emission of light as they pass through the active-region's active-area 36B (FIG. 9), until they reach the FCSEL's single light reflecting structure 38, where they 42F will be made to start a new oscillation cycle. Creating an optical cavity that is folded backward onto itself, which is capable during light-wave oscillation of the amplification of fundamental diode produced light via the process of stimulated-emission.

Furthermore, a FCSEL's polyhedral prism waveguide 34, 43, 46, as illustrated in FIGS. 13, 14, 15, 16, 17, and 18, are constructed as monolithic polyhedral shaped devices that are conducive to the total internal reflection of intracavity produced optical radiation using an optical material with an absolute lattice mismatch to other semiconductor materials used in the construction of the FCSEL's remaining semiconductor layers. Therefore, within the FCSEL design, an internal reflecting polyhedral prism waveguide 34, 43, 46 which redirect all optical radiation entering its top plane-parallel and flat horizontal front-face surface 34D, 43C, 46B backwards toward the FCSEL's partially reflecting quarter-wave mirror stack assembly 38 (FIG. 9) is used.

Moreover, a FCSEL's polyhedral prism waveguide 34, 43, 46, as illustrated in FIGS. 2 13, 14, 15, 16, 17, and 18, while constructed from (SiO2) "Fused Silicon-Dioxide" or some other suitable are frequency specific material will allow the FCSEL's polyhedral prism waveguide to internally redirect and transmit all optical radiation incidental to its top plane-parallel and flat horizontal front-face surface. Depending on the optical material used to construct a FCSEL's polyhedral prism waveguide 34, 43, 46 it will have the capability of transmitting all optical radiation having wavelengths that range from the ultraviolet (i.e., having a wavelength of "105" nanometers) to the far infrared (i.e., having a wavelength of "10,000" nanometers).

Although the FCSEL invention has been described in detail with references to specific embodiments, various modifications can be made without departing from the scope of the invention. For example, in order to increase the energy, while decreasing the wavelength per photon of emitted light, the active-regions 28 (FIG. 3), 36 (FIG. 9) could contain "Phosphorus" in an amount that will form a lattice-matched, quaternary, (InGaAsP) "Indium-Gallium-Arsenic-Phosphide" material, while another option could be that a FCSEL's quarterwave mirror stack assembly 38 (FIG. 7) could be comprised of alternating layers of binary (AlAs) "Aluminum-Arsenide", and ternary (InGaP) "Indium-Gallium-Phosphide" materials, where the choice between one semiconductor or optical material over another for constructing the quarterwave mirror stack assembly 38 (FIG. 8) of a FCSEL is frequency determined, rather than structurally determined.

Furthermore, the various semiconductor and optical materials, along with their distribution sizes are frequency specific and interchangeable within this design; indicating that the FCSEL design has novelty that is independent of any one kind of material or any one kind of material size that could or might be used in its construction.

What is claimed is:

1. A surface-emitting laser, comprising:
  a first confinement cladding layer;
  a second confinement cladding layer;
  an active gain area between the first and second confinement cladding layers;
  a first reflector assembly adjacent the first confinement cladding layer, wherein the first reflector assembly includes a polyhedral prism waveguide having a non-reflecting surface facing the first confinement cladding layer and having at least one totally-reflecting surface for transversely redirecting incident photonic emissions to a different longitudinal location of the polyhedral prism waveguide; and
  a second reflector assembly, wherein the second confinement cladding layer is between the active gain area and the second reflector assembly.

2. The laser of claim 1, wherein:
  the first confinement layer is parallel to the non-reflecting surface of the polyhedral prism waveguide; and
  the second confinement layer is parallel to the non-reflecting surface of the polyhedral prism waveguide.

3. The laser of claim 2, wherein the active gain area includes a multiple quantum well, wherein the multiple quantum well comprises a plurality of quantum well layers, and wherein the plurality of quantum well layers are parallel to the non-reflecting surface of the polyhedral prism waveguide.

4. The laser of claim 1, wherein the first confinement cladding layer includes an upper surface and a lower surface, wherein the upper surface is adjacent to the active gain area, and wherein the first confinement cladding layer includes Gallium-Aluminum-Arsenide, wherein the concentration of Gallium increases from the lower surface to the upper surface and the concentration of Aluminum decreases from the lower surface to the upper surface.

5. The laser of claim 4, wherein the first confinement cladding layer includes n-doped Gallium-Aluminum-Arsenide.

6. The laser of claim 4, wherein the second confinement cladding layer includes an upper surface and a lower surface, wherein the lower surface is adjacent to the active gain area, and wherein the second confinement cladding layer includes Gallium-Aluminum-Arsenide, wherein the concentration of Gallium increases from the upper surface to the lower surface and the concentration of Aluminum decreases from the upper surface to the lower surface.

7. The laser of claim 6, wherein:
  the first confinement cladding layer includes n-doped Gallium-Aluminum-Arsenide; and
  the second confinement cladding layer includes p-doped Gallium-Aluminum-Arsenide.

8. The laser of claim 6, wherein the active gain area includes a multiple quantum well.

9. The laser of claim 8, wherein the multiple quantum well includes a plurality of quantum wells and a plurality of barrier layers.

10. The laser of claim 9, wherein each of the quantum wells include Gallium Arsenide.

11. The laser of claim 10, wherein each of the barrier layers of the multiple quantum well includes Gallium-Aluminum-Arsenide.

12. The laser of claim 11, wherein the multiple quantum well includes seven quantum wells and six barrier layers.

13. The laser of claim 6, further comprising:
  a first contact layer, wherein the first confinement cladding layer is between the first contact layer and the active gain area; and
  a second contact layer, wherein the second confinement cladding layer is between the active gain area and the second contact layer.

14. The laser of claim 1, wherein the polyhedral prism waveguide includes a corner cube polyhedral prism waveguide.

15. The laser of claim 1, wherein the first reflector assembly includes fused silicon dioxide.

16. The laser of claim 1, wherein:
the first reflector assembly includes a corner cube polyhedral prism waveguide; and
the second reflector assembly includes a quarter wave mirror stack.

17. The laser of claim 1, wherein the polyhedral prism waveguide includes a right-angle prism shaped polyhedral prism waveguide.

18. The laser of claim 1, wherein the polyhedral prism waveguide includes a conical prism shaped polyhedral prism waveguide.

19. The laser of claim 1, wherein the second reflector assembly includes a mirror stack.

20. The laser of claim 19, wherein the mirror stack includes a quarter wave mirror stack.

21. A device, comprising an array of semiconductor lasers, wherein each semiconductor laser includes:
a first confinement cladding layer;
a second confinement cladding layer;
an active gain area between the first and second confinement cladding layers;
a first reflector assembly adjacent the first confinement cladding layer, wherein the first reflector assembly includes a polyhedral prism waveguide having a non-reflecting surface facing the first confinement cladding layer and having at least one totally-reflecting surface for transversely redirecting incident photonic emissions to a different longitudinal location of the polyhedral prism waveguide; and
a second reflector assembly, wherein the second confinement cladding layer is between the active gain area and the second reflector assembly.

22. The device of claim 21, wherein the first confinement cladding layer includes an upper surface and a lower surface, wherein the upper surface is adjacent to the active gain area, and wherein the first confinement cladding layer includes n-doped Gallium-Aluminum-Arsenide, wherein the concentration of Gallium increases from the lower surface to the upper surface and the concentration of Aluminum decreases from the lower surface to the upper surface.

23. The device of claim 22, wherein the second confinement cladding layer includes an upper surface and a lower surface, wherein the lower surface is adjacent to the active gain area, and wherein the second confinement cladding layer includes p-doped Gallium-Aluminum-Arsenide, wherein the concentration of Gallium increases from the upper surface to the lower surface and the concentration of Aluminum decreases from the upper surface to the lower surface.

24. The device of claim 23, wherein the active gain area includes a multiple quantum well.

25. The device of claim 24, further comprising:
a first contact layer, wherein the first confinement cladding layer is between the first contact layer and the active gain area; and
a second contact layer, wherein the second confinement cladding layer is between the active gain area and the second contact layer.

26. The device of claim 21, wherein the polyhedral prism waveguide includes a corner cube polyhedral prism waveguide.

27. The device of claim 21, wherein the second reflector assembly includes a quarter wave mirror stack.

28. The device of claim 21, wherein the semiconductor lasers of the array are simultaneously addressable.

29. The device of claim 21, wherein the semiconductor lasers of the array are individually addressable. dividually addressable.

30. The device of claim 21, wherein the polyhedral prism waveguide includes a right-angle prism shaped polyhedral prism waveguide.

31. The device of claim 21, wherein the polyhedral prism waveguide includes a conical prism shaped polyhedral prism waveguide.

32. The device of claim 21, wherein:
the first confinement layer is parallel to the non-reflecting surface of the polyhedral prism waveguide; and
the second confinement layer is parallel to the non-reflecting surface of the polyhedral prism waveguide.

33. The device of claim 32, wherein the active gain area includes a multiple quantum well, wherein the multiple quantum well comprises a plurality of quantum well layers, and wherein the plurality of quantum well layers are parallel to the non-reflecting surface of the polyhedral prism waveguide.

34. The device of claim 21, wherein the second reflector assembly includes a quarter wave mirror stack.

35. A method of fabricating a surface emitting laser, comprising:
forming a first confinement cladding layer on a first surface of a substrate;
forming an active gain area on the first confinement cladding layer;
forming a second confinement cladding layer on the active area;
forming a first reflector assembly adjacent the first confinement cladding layer, wherein the first reflector assembly includes a polyhedral prism waveguide having a non-reflecting surface facing the first confinement cladding layer and having at least one totally-reflecting surface for transversly redirecting incident photonic emissions to a different longitudinal location of the polyhedral prism waveguide; and
forming a second reflector assembly, wherein the second confinement cladding layer is between the active gain area and the second reflector assembly.

36. The method of claim 35, wherein forming the first confinement cladding layer includes forming a first confinement cladding layer that includes an upper surface and a lower surface, wherein the upper surface is adjacent to the active gain area, and wherein the first confinement cladding layer includes n-doped Gallium-Aluminum-Arsenide, wherein the concentration of Gallium increases from the lower surface to the upper surface and the concentration of Aluminum decreases from the lower surface to the upper surface.

37. The method of claim 36, wherein forming the first confinement cladding layer includes depositing the first confinement cladding layer on the first surface of the substrate using molecular beam epitaxy.

38. The method of claim 36, wherein forming the first confinement cladding layer includes depositing the first confinement cladding layer on the first surface of the substrate using metallic oxide chemical vapor deposition.

39. The method of claim 36, wherein forming the second confinement cladding layer includes forming a second confinement cladding layer that includes an upper surface and a lower surface, wherein the lower surface is adjacent to the active gain area, and wherein the second confinement cladding layer includes p-doped Gallium-Aluminum-Arsenide, wherein the concentration of Gallium increases from the upper surface to the lower surface and the concentration of Aluminum decreases from the upper surface to the lower surface.

40. The method of claim 39, wherein one of forming the first and second confinement cladding layers includes depositing one of the first and second confinement cladding layers using molecular beam epitaxy.

41. The method of claim 39, wherein one of forming the first and second confinement cladding layers includes depositing one of the first and second confinement cladding layers using metallic oxide chemical vapor deposition.

42. The method of claim 35, wherein forming the active gain area includes forming a multiple quantum well.

43. The method of claim 39, wherein forming the active gain area includes forming a multiple quantum well.

44. The method of claim 35, wherein forming the first reflector assembly includes forming a corner cube polyhedral prism waveguide.

45. The method of claim 39, wherein forming the first reflector assembly includes forming a corner cube polyhedral prism waveguide.

46. The method of claim 35, further comprising forming a contact layer on the second confinement cladding layer.

47. The method of claim 35, wherein forming the second reflector assembly includes forming a quarter wave mirror stack.

48. The method of claim 35, wherein forming the first reflector assembly includes forming a right-angle prism shaped polyhedral prism waveguide.

49. The method of claim 35, wherein forming the first reflector assembly includes forming a conical prism shaped polyhedral prism waveguide.

50. The method of claim 35, wherein forming the second reflector assembly includes forming a quarter wave mirror stack.

51. A surface-emitting laser, comprising:

a double-heterojunction semiconductor diode active region;

a first reflector assembly adjacent the double-heterojunction semiconductor diode active region, wherein the first reflector assembly includes a polyhedral prism waveguide having a non-reflecting surface facing the first confinement cladding layer and having at least one totally-reflecting surface for transversely redirecting incident photonic emissions to a different longitudinal location of the polyhedral prism waveguide; and a second reflector assembly, wherein the double-heterojunction semiconductor diode active region is between the first reflector assembly and the second reflector assembly.

52. The laser of claim 51, wherein the polyhedral prism waveguide includes a corner cube polyhedral prism waveguide.

53. The laser of claim 51, wherein:

the first reflector assembly includes a corner cube polyhedral prism waveguide; and the second reflector assembly includes a quarter wave mirror stack.

54. The laser of claim 51, wherein the polyhedral prism waveguide includes a right-angle prism shaped polyhedral prism waveguide.

55. The laser of claim 51, wherein the polyhedral prism waveguide includes a conical prism shaped polyhedral prism waveguide.

56. The laser of claim 51, wherein the second reflector assembly includes a mirror stack.

57. The laser of claim 56, wherein the mirror stack includes a quarter wave mirror stack.

* * * * *